United States Patent
Kameyama et al.

(10) Patent No.: US 9,146,598 B2
(45) Date of Patent: Sep. 29, 2015

(54) MONITOR CIRCUIT, SEMICONDUCTOR INTEGRATED CIRCUIT, SEMICONDUCTOR DEVICE, AND METHOD OF CONTROLLING POWER SUPPLY VOLTAGE OF SEMICONDUCTOR DEVICE

(71) Applicant: Renesas Mobile Corporation, Tokyo (JP)

(72) Inventors: Tadashi Kameyama, Tokyo (JP); Takanobu Naruse, Tokyo (JP); Yohei Akita, Tokyo (JP); Hirotaka Hara, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 33 days.

(21) Appl. No.: 14/165,624

(22) Filed: Jan. 28, 2014

(65) Prior Publication Data
US 2014/0210544 A1 Jul. 31, 2014

(30) Foreign Application Priority Data
Jan. 30, 2013 (JP) .................................. 2013-015269

(51) Int. Cl.
| G05F 1/10 | (2006.01) |
| G05F 3/02 | (2006.01) |
| G06F 1/28 | (2006.01) |
| G01R 19/165 | (2006.01) |
| G01R 19/32 | (2006.01) |

(52) U.S. Cl.
CPC ............ *G06F 1/28* (2013.01); *G01R 19/16552* (2013.01); *G01R 19/32* (2013.01)

(58) Field of Classification Search
CPC ....... H03K 5/2481; H03K 5/249; H03K 5/08; H03K 5/24; G01R 19/16519
USPC .......................................... 327/77, 530, 538
See application file for complete search history.

(56) References Cited

U.S. PATENT DOCUMENTS
2006/0034110 A1 * 2/2006 Deason et al. ................ 363/146

FOREIGN PATENT DOCUMENTS
| JP | 09329628 A | * 12/1997 |
| JP | 11046011 A | * 2/1999 |
| JP | 2000-346909 A | 12/2000 |
| JP | 2008-227192 A | 9/2008 |

* cited by examiner

*Primary Examiner* — Quan Tra
(74) *Attorney, Agent, or Firm* — Miles & Stockbridge P.C.

(57) ABSTRACT

A monitor circuit includes a reference voltage generating unit that generates first and second reference voltages, a first amplifier unit that amplifies a differential voltage between the first reference voltage and the second reference voltage, a second amplifier unit that amplifies a differential voltage between an internal power supply voltage being supplied to a functional block provided in the semiconductor integrated circuit and the first reference voltage, and a comparator unit that compares an amplification result of the first amplifier unit with an amplification result of the second amplifier unit and outputs a comparison result as a measurement result.

15 Claims, 27 Drawing Sheets

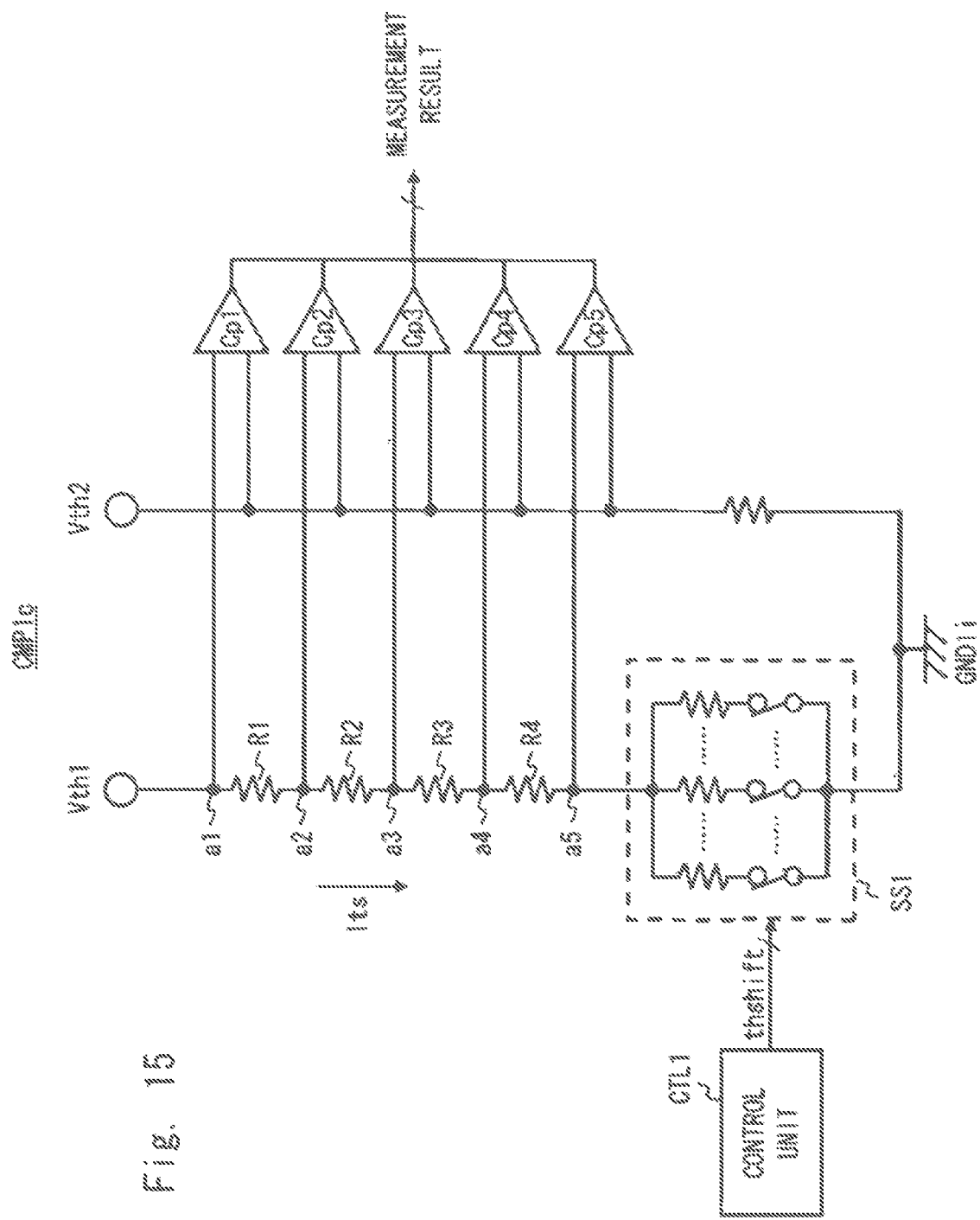

MONITOR CIRCUIT, SEMICONDUCTOR INTEGRATED CIRCUIT, SEMICONDUCTOR DEVICE, AND METHOD OF CONTROLLING POWER SUPPLY VOLTAGE OF SEMICONDUCTOR DEVICE

CROSS-REFERENCES TO RELATED APPLICATIONS

This application is based upon and claims the benefit of priority from Japanese patent application No. 2013-015269, filed on Jan. 30, 2013, the disclosure of which is Incorporated herein in its entirety by reference.

BACKGROUND

The present invention relates to a monitor circuit, a semiconductor integrated circuit, a semiconductor device, and a method of controlling the power supply voltage of a semiconductor device.

As semiconductor integrated circuits are miniaturized and a high degree of integration thereof is achieved, the power supply voltage supplied to a semiconductor integrated circuit has become low. In accordance therewith, the power supply voltage range in which a semiconductor integrated circuit can operate has also become narrow. Therefore, it is required to precisely measure the power supply voltage supplied to a semiconductor integrated circuit, and to supply the semiconductor integrated circuit with a stable power supply voltage based on the measurement result.

Meanwhile, Japanese Unexamined Patent Application Publication Nos. 2000-346909 and 2008-227102 each disclose a monitor circuit that measures the voltage value of a particular portion inside a chip.

SUMMARY

The inventors of the present application have encountered various problems in developing a semiconductor integrated circuit used for electronic devices, e.g., car navigation devices, wireless communication terminals and the like. Embodiments disclosed in the present application each provide a monitor circuit that is suitable for electronic devices whose operation reliability is of great importance, e.g., car navigation devices, wireless communication terminals and the like. Other problems and novel features will become apparent from the description of the present specification and accompanying drawings.

According to one embodiment, a monitor circuit includes: a reference voltage generating unit that generates first and second reference voltages; a first amplifier unit that amplifies a differential voltage between the first reference voltage and the second reference voltage; a second amplifier unit that amplifies a differential voltage between an internal power supply voltage being supplied to a functional block provided in the semiconductor integrated circuit and the first reference voltage; and a comparator unit that compares an amplification result of the first amplifier unit with an amplification result of the second amplifier unit and outputs a comparison result as a measurement result, According to the one embodiment, a monitor circuit, a semiconductor integrated circuit, a semiconductor device, and a method of controlling the power supply voltage of a semiconductor device of excellent quality can be provided.

BRIEF DESCRIPTION OF THE DRAWINGS

The above and other aspects, advantages and features will become more apparent from the following description of certain embodiments taken in conjunction with the accompanying drawings, in which:

FIG. 15 is a diagram showing a third specific exemplary structure of the comparator unit CMP1 according to the fourth embodiment;

DETAILED DESCRIPTION

Figure 1:
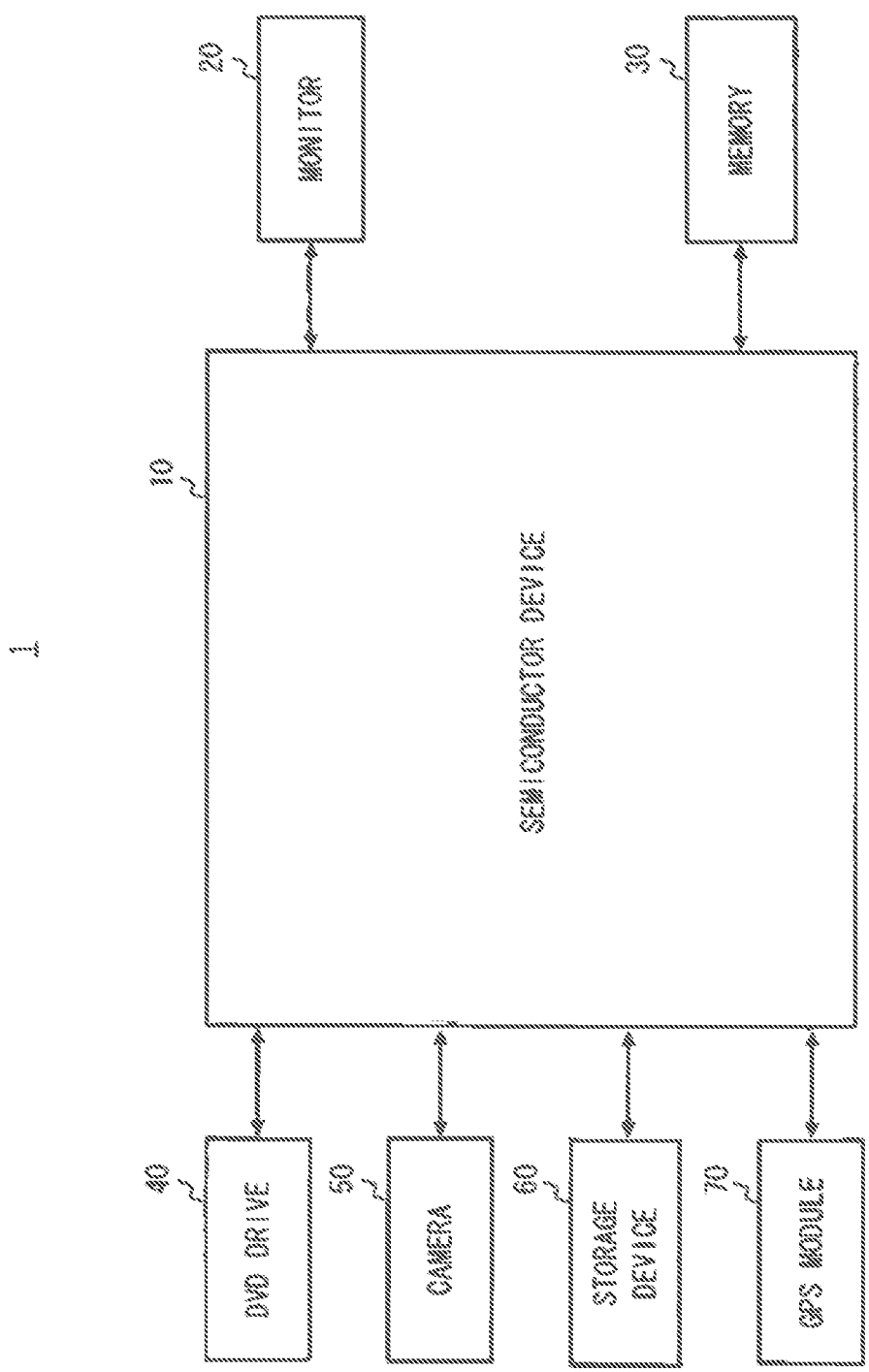
FIG. 1 is a block diagram shoeing an exemplary structure of an electronic device 1 according to a first embodiment.

In the following, with reference to the drawings, a description will be given of embodiments. Note that, since the drawings are simplified, the technical range of the embodiments should not be narrowly construed on the basis of the illustrations of the drawings. Further, identical reference characters are allotted to identical elements, and any repetitive description will be omitted.

The following description of the embodiments will be given as being divided into a plurality of sections or embodiments when necessary for the sake of convenience. However, unless explicitly stated otherwise, they are not unrelated to one another, and one represents a variation, an application, a detailed description, or a supplemental description of some of or all of the other ones. Further, in the following embodiments, when reference is made to the number of elements or the like (including the number of pieces, numerical values, quantities, ranges and the like), unless explicitly stated otherwise or except for the case where any element is apparently limited to a particular number in principle, the element or the like is not limited to the particular neither, and the number thereof may be equal to or more or less than the particular number.

Further, in the following embodiments, each constituent element (including an operation step and the like) is not necessarily essential, unless explicitly stated otherwise or except for the case where it is considered to be apparently essential in principle. Similarly, in the following embodiments, when reference is made to the shape, positional relationship and the like of any constituent element, it is understood that any shape substantially approximating or similar to the shape and the like is included, unless explicitly stated otherwise or except for the case where it is considered to be apparently excluded in principle. The same holds true for the number and the like (including the number of pieces, numerical values, quantities, ranges and the like) of any such constituent element.

<First Embodiment>

(Structure of Electronic System)

Firstly, with reference to FIG. 1, a description will be given of the structure of an electronic device which is a semiconductor device according to the present embodiment. FIG. 1 is a block diagram shoeing an exemplary structure of an electronic device 1 according to a first embodiment. As an example, a description will be given of the case where the electronic device 1 is a car navigation device installed in an automobile. As shown in FIG. 1, the electronic device 1 includes a semiconductor device 10, a monitor 20, a memory 30, a DVD (Digital Versatile Disc) drive 40, a camera 50, a storage device 60, and a GPS (Global Positioning System) module 70.

The semiconductor device 10 controls the monitor 20, the memory 30, the DVD drive 40, the camera 50, the storage device 60, and the GPS module 70. The structure of the semiconductor device 10 shown in FIG. 1 may include one chip, or it may include a plurality of chips. For example, when the structure of the monitor 20 includes a plurality of monitors, the structure of the semiconductor device 10 also includes a plurality of chips. A detailed description of the internal structure of the semiconductor device 10 according to the first embodiment will be given later.

The monitor 20 is a display device, e.g., a liquid crystal display (LCD), an organic EL display (OLED: Organic Light-Emitting Diode) or the like. The monitor 20 displays various images, e.g., those recorded on a DVD inserted into the DVD drive 40, images shot by the camera 50 and the like, not to mention navigation-purpose images. Switching of the images displayed on the monitor 20 is controlled by the semiconductor device 10. When the structure of the monitor 20 includes a plurality of monitors, for example, the monitor at the driver's seat can display the navigation-purpose images, whereas the monitor at the front passenger seat or the rear seat can display images recorded on a DVD (for example, a motion picture). That is, a plurality of monitors can display different images.

The memory (external memory) 30 stores a program or data used by the semiconductor device 10. In many cases, the memory 30 is a DRAM (Dynamic Random Access Memory), which is a volatile memory from which the stored data is deleted when a power supply is turned off. It goes without saying that the memory 30 maybe a non-volatile memory that retains the stored data even when the power supply is turned off.

The DVD drive 40 reads images recorded on a DVD. The images on the DVD inserted into the DVD drive 40 are output from the monitor 20.

The camera 50 is, for example, a so-called rear view camera mounted on the rear side at the exterior of the automobile. The camera 50 shoots images of the rear area of the automobile which is a blind spot, namely, an area that cannot be seen from the driver's seat, when the automobile travels backward. The images shot by the camera 50 are output from the monitor 20. For example, while the automobile travels backward (when the automobile is put into reverse gear), the images shot by the camera 50 are displayed on the monitor 20 at the driver's seat.

The storage device 60 is preferably a high-capacity storage device such as a hard disk, and stores the navigation-purpose images (map information).

The GPS module 70 includes an antenna, an RF circuit, and a baseband circuit, and outputs the current position of the automobile to the semiconductor device 10, based on the positional information received from satellites.

Note that the semiconductor device 10 according to the present embodiment can also be applied to other electronic devices than the electronic device 1 shown in FIG. 1, such as wireless communication terminals, as it is not limited to said electronic device 1. The wireless communication terminals include, for example, smartphones, feature phones (for example, flip-type mobile phone terminals), portable game consoles, tablet PCs (Personal Computers), note PCs and the like.

(Overview of Semiconductor Device 10 According to First Embodiment)

Figure 2:
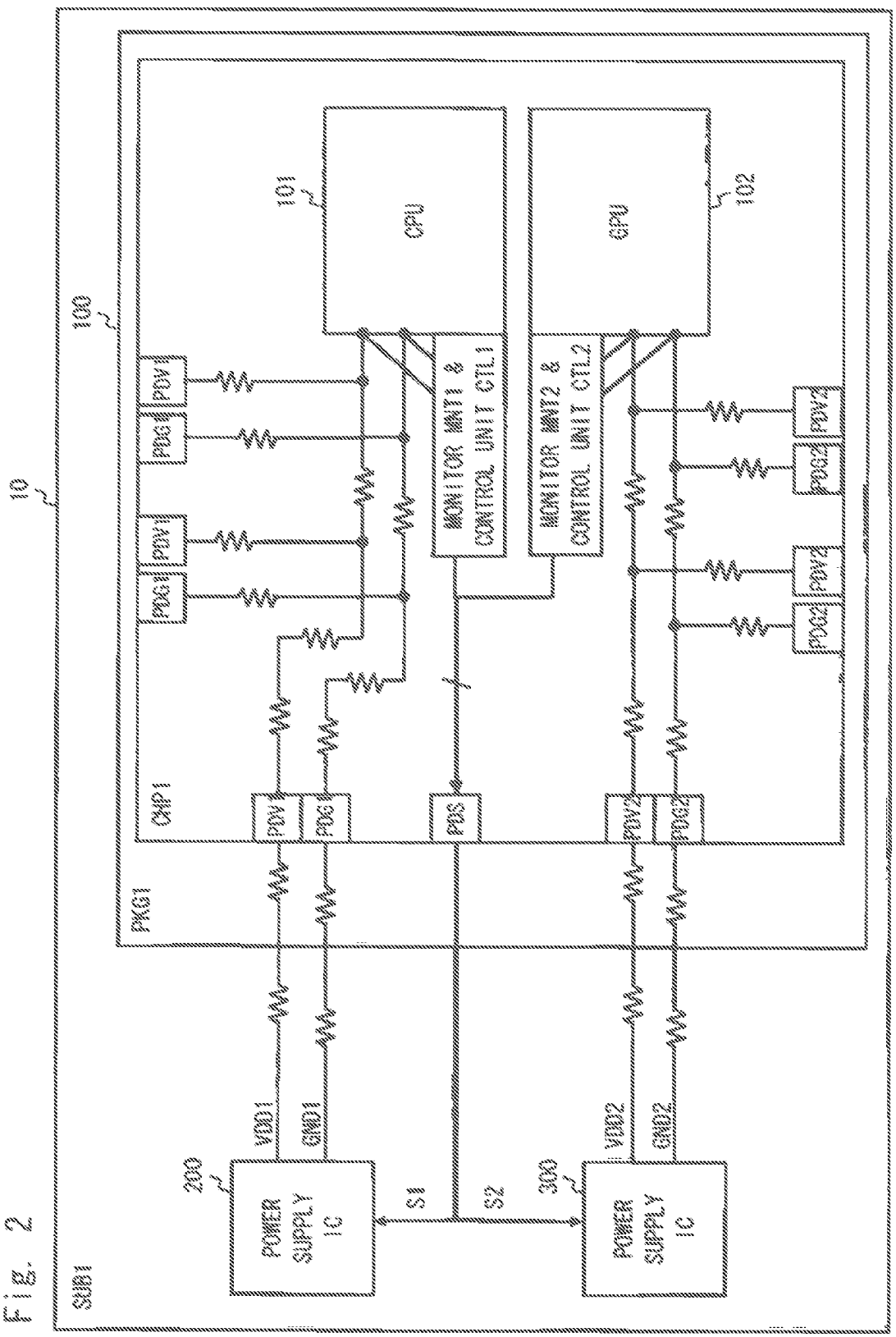
FIG. 2 is a plan view showing an exemplary structure of the semiconductor device 10 according to the first embodiments.
Figure 3:
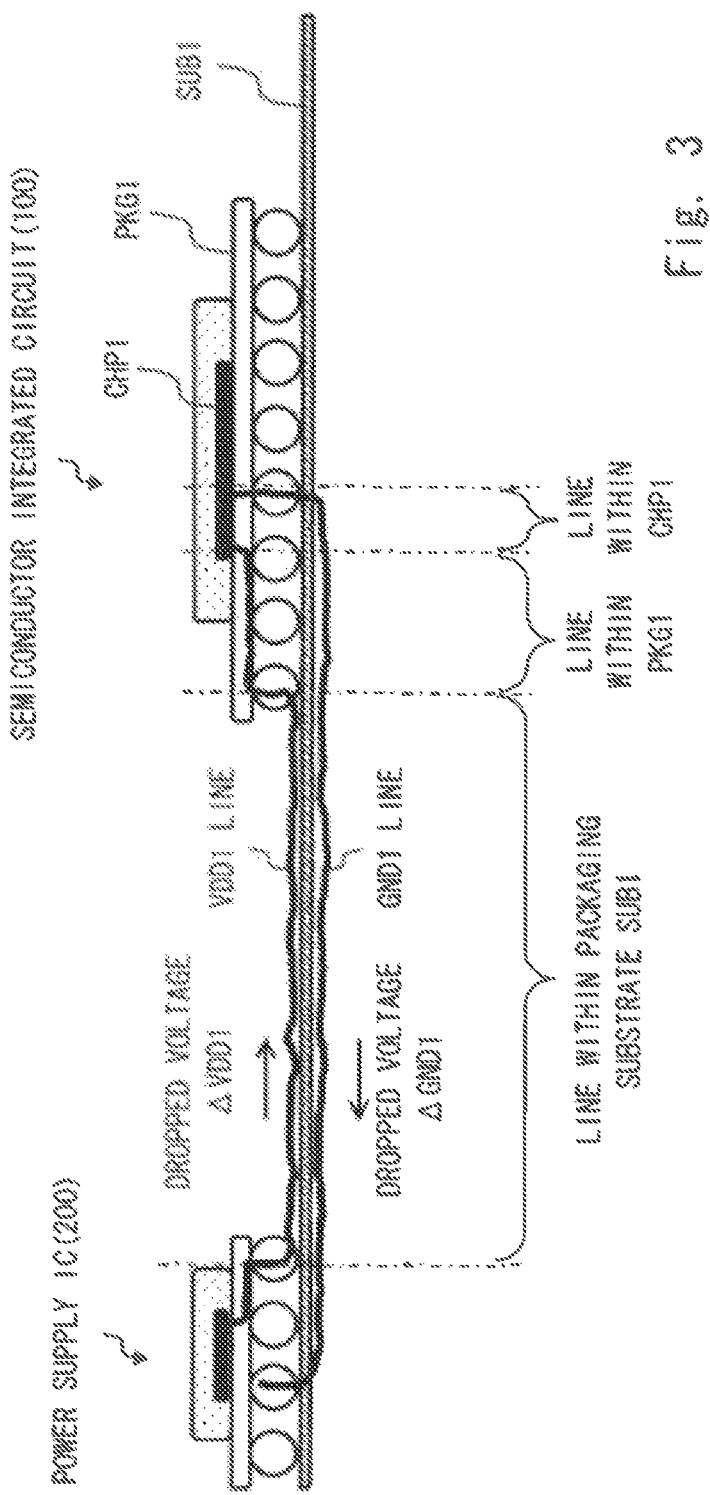
FIG. 3 is a schematic cross-sectional view showing an exemplary structure of the semiconductor device 10 according to the first embodiment.
Figure 4:
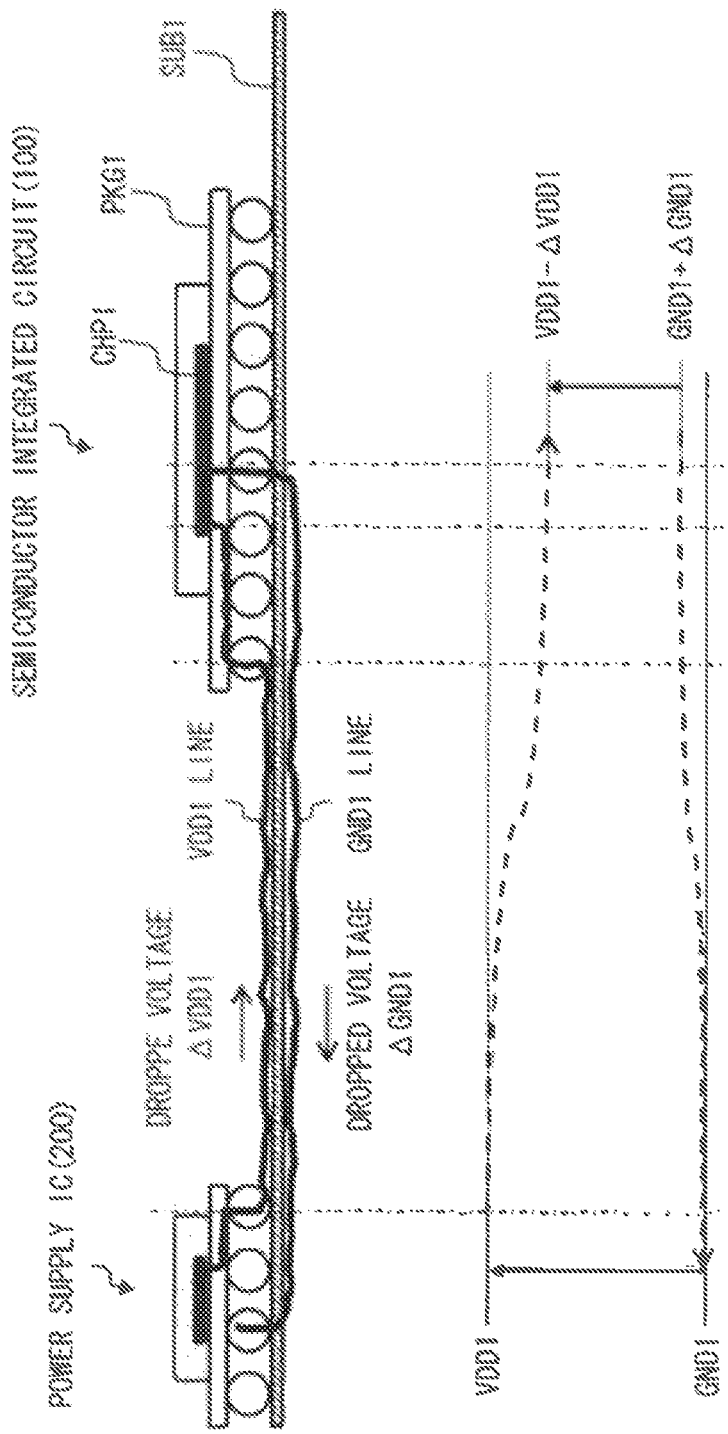
FIG. 4 is a schematic cross-sectional view showing an exemplary structure of the semiconductor device 10 according to the first embodiment.
Figure 5:
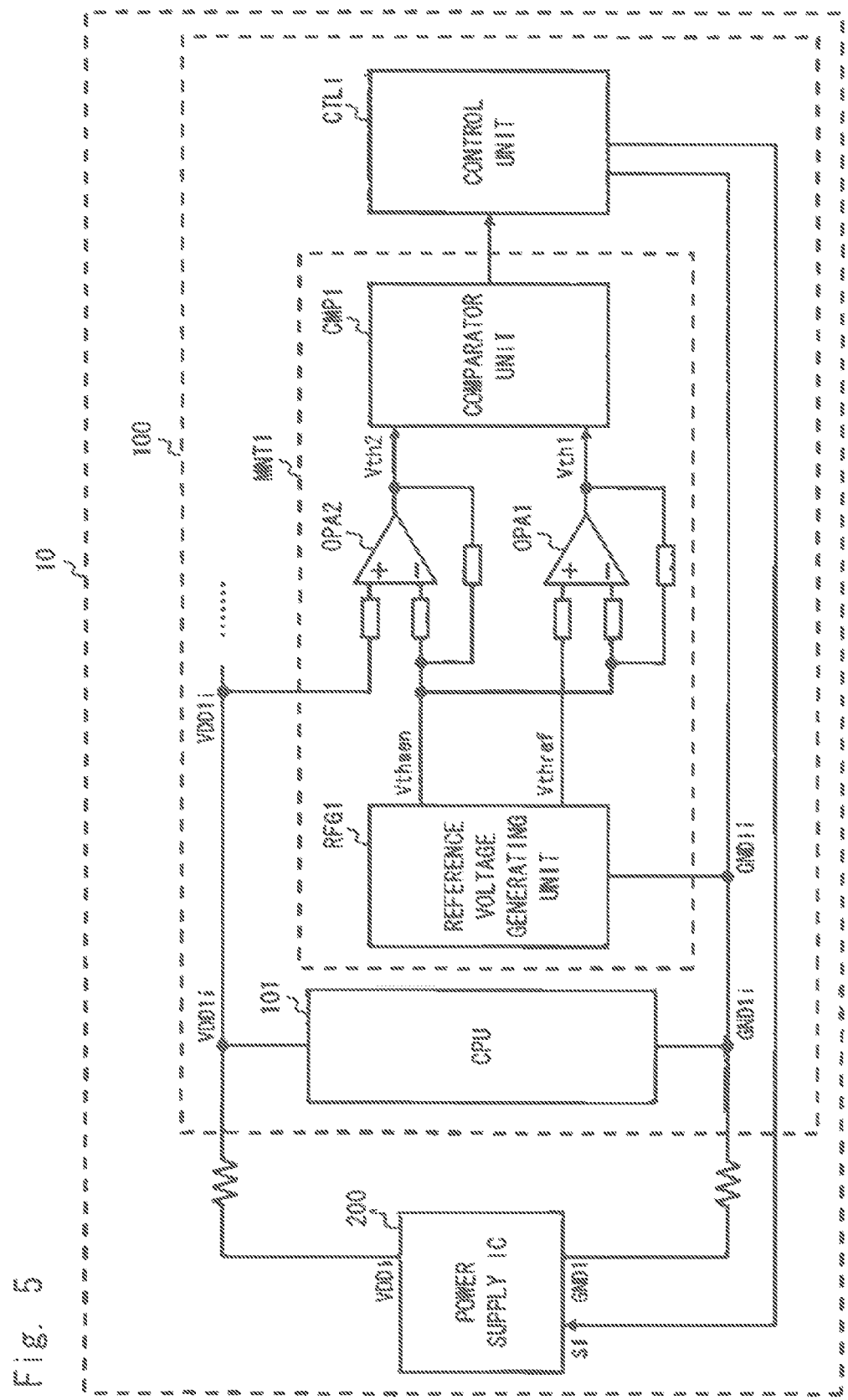
FIG. 5 is a block diagram showing an exemplary structure of the semiconductor device 10 according to the first embodiment.

FIG. 2 is a plan view showing an exemplary structure of the semiconductor device 10 according to the first embodiment. FIGS. 3 and 4 are schematic cross-sectional views each showing an exemplary structure of the semiconductor device 10 according to the first embodiment. FIG. 5 is a block diagram showing an exemplary structure of the semiconductor device 10 according to the first embodiment.

In the semiconductor device 10 shown in FIG. 2, a semiconductor integrated circuit 100 and power supply ICs 200 and 300 are provided on a packaging substrate SUB1. In the semiconductor integrated circuit 100, a semiconductor chip CMP1 is provided on a package PKG1. The semiconductor chip CMP1 includes a CPU 101 and a GPU 102 as functional blocks, monitors MNT1 and MNT2, control units CTL1 and CTL2, and a plurality of pads PDV1, PDG1, PDV2, PDG2, and PDS.

The power supply IC 200 generates a power supply voltage VDD1 and a ground voltage GND1 for driving the CPU 101. The power supply voltage VDD1 generated by the power supply IC 200 is supplied to a power supply voltage terminal (hereinafter referred to as the power supply voltage terminal VDD1$i$) of the CPU 101 as an internal power supply voltage VDD1$i$ via a power supply voltage line (see FIG. 5). The ground voltage GND1 generated by the power supply IC 200 is supplied to a ground voltage terminal (hereinafter referred to as the ground voltage terminal GND1$i$) of the CPU 101 as an internal ground voltage (first internal ground voltage) GND1$i$ via a ground voltage line (see FIG. 5). Thus, the CPU 101 operates by being supplied with the internal power supply voltage VDD1$i$ and the internal ground voltage GND1$i$.

As shown in FIGS. 3 and 4, the power supply voltage VDD1 drops due to the parasitic resistance of the power supply voltage line (the power supply voltage line arranged on the packaging substrate SUB1, the package PKG1, and the semiconductor chip CMP1), current consumption by the CPU 101 and the like, to become the internal power supply voltage VDD1$i$ (see FIG. 5). Further, the ground voltage GND1 rises due to the parasitic resistance of the ground voltage line (the ground voltage line arranged on the packaging substrate SUB1, the package PKG1, and the semiconductor chip CMP1), current consumption of the CPU 101 and the like, to become the internal ground voltage GND1$i$ (see FIG. 55). Accordingly, the power supply voltage VDD1 generated by the power supply IC 200 and the internal power supply voltage VDD1$i$ supplied to the CPU 101 are different from each other in voltage value. Further, the ground voltage GND1 generated by the power supply IC 200 and the internal power supply voltage GND1$i$ supplied to the CPU 101 are different from each other in voltage value.

Here, the following equations (1) and (2) ere established.

$$VDD1i = VDD1 - \Delta VDD1 \qquad (1)$$

Note that VDD1$i$ represents the value of the internal power supply voltage VDD1$i$; VDD1 represents the value of the power supply voltage VDD1; and $\Delta$VDD1 represents a voltage drop caused by the parasitic resistance of the power supply voltage line, the current consumption of the CPU 101 and the like.

$$GND1i = GND1 + \Delta GND1 \qquad (2)$$

Note that, GND1$i$ represents the value of the internal ground voltage GND1$i$; GND1 represents the value of the ground voltage GND1; and $\Delta$GND1 represents a voltage drop caused by the parasitic resistance of the ground voltage line, the current consumption of the CPU 101 and the like.

The monitor MNT1 monitors (measures) the value of a voltage Va (=VDD1$i$−GND1$i$) that corresponds to the supply voltage supplied to the CPU 101. Note that the monitor MNT1 is arranged in close proximity to the CPU 101 so as to be able to precisely monitor the voltage. The control unit CTL1 generates e control signal (digital value) S1 corresponding to the measurement result of the monitor MNT1. The power supply IC 200 adjusts the value of the power supply voltage VDD1 based on the control signal S1. Thus, it becomes possible to supply the CPU 101 with the internal power supply voltage VDD1$i$ within the range in which operations can be performed.

The power supply IC 300 generates a power supply voltage VDD2 and a ground voltage GND2 for driving the GPU 102. The power supply voltage VDD2 generated by the power supply IC 300 is supplied to the power supply voltage terminal (hereinafter referred to as the power supply voltage terminal VDD2$i$) of the GPU 102 as an internal power supply voltage VDD2$i$ via the power supply voltage line. The ground voltage GND2 generated by the power supply IC 300 is supplied to a ground voltage terminal (hereinafter referred to as the ground voltage terminal GND2$i$) of the CPU 102 as an internal ground voltage GND2$i$ via a ground voltage line. Thus, the GPU 102 operates by being supplied with the internal power supply voltage VDD2$i$ and the internal ground voltage GND2$i$.

The monitor MNT2 monitors (measures) the value of a voltage (=VDD2$i$−GND2$i$) that corresponds to the supply voltage supplied to the GPU 102. Note that the monitor MNT2 is arranged in close proximity to the GPU 102 so as to be able to precisely monitor the voltage. The control unit CTL2 generates a control signal (digital value) S2 corresponding to the measurement result of the monitor MNT2. The power supply IC 300 adjusts the value of the power supply voltage VDD2 based on the control signal S2. Thus, it becomes possible to supply the GPU 102 with the internal power supply voltage VDD2$i$ within the range in which operations can be performed.

(Details of Semiconductor Device 10 according to First Embodiment)

Figure 6A:
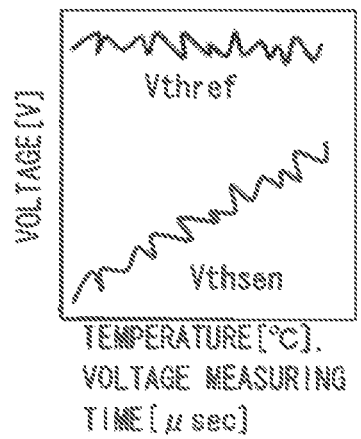
FIG. 6A is a diagram showing the temperature dependence of reference voltages Vthsen and Vthref.
Figure 6B:
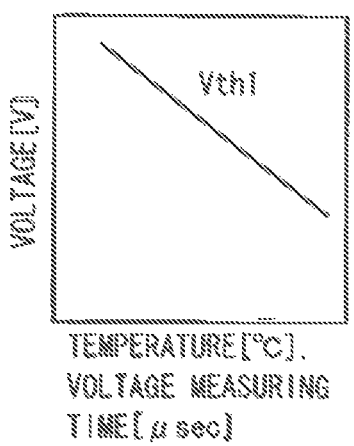
FIG. 6B is a diagram showing the temperature dependence of an amplified signal Vth1.
Figure 6C:
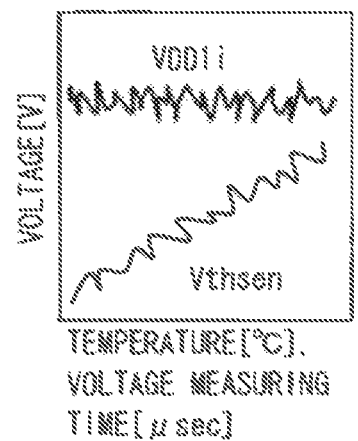
FIG. 6C is a diagram showing the temperature dependence of an internal power supply voltage VDD1$i$ and the reference voltage Vthsen.
Figure 6D:
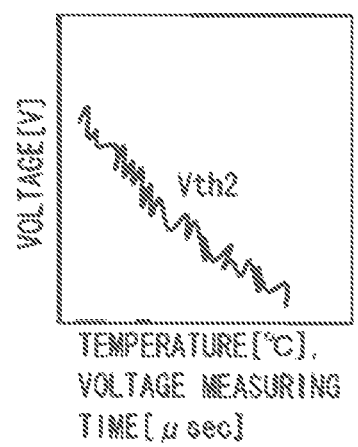
FIG. 6D is a diagram showing the temperature dependence of an amplified signal Vth2.

FIG. 5 is a block diagram showing an exemplary structure of the semiconductor device 10 according to the first embodiment. FIG. 6A is a diagram showing the temperature dependence of reference voltages Vthsen and Vthref. FIG. 6B is a diagram showing the temperature dependence of an amplified signal Vth1. FIG. 6C is a diagram showing the temperature dependence of the internal power supply voltage VDD1$i$ and the reference voltage Vthsen. FIG. 6D is a diagram showing the temperature dependence of an amplified signal Vth2.

Note that, since the relationship among the power supply IC 200, the CPU 101, the monitor MNT1, and the control unit CTL1 and the relationship among the power supply IC 300, the GPU 102, the monitor MNT2, and the control unit CTL2 are basically the same, in the following, a description will be solely given of the power supply IC 200, the CPU 101, the monitor MNT1, and the control unit CTL1.

(monitor MNT1)

As shown in FIG. 5, the monitor MNT1 has a reference voltage generating unit RFG1, an amplifier unit (first amplifier unit) OPA1, an amplifier unit (second amplifier unit) OPA2, and a comparator unit CMP1.

(Reference Voltage Generating Unit RFG1)

The reference voltage generating unit RFG1 generates a reference voltage (first, reference voltage) Vthsen and a reference voltage (second reference voltage) Vthref. More specifically, the reference voltage generating unit RFG1 generates the reference voltage Vthsen and the reference voltage Vthref that is generated based on the ground voltage (internal ground voltage GND1$i$) that is common to the reference voltage Vthsen and that is different in value from the reference voltage Vthsen.

The reference voltage generating unit RFG1 is, for example, a bandgap reference temperature sensor (see FIG. 6A) that generates the reference voltage Vthsen with great temperature dependence end the reference voltage Vthref which is smaller in temperature dependence than the reference voltage Vthsen (more preferably, the reference voltage Vthref is not temperature-dependent). In the present embodiment, a description will be given of an exemplary case where the reference voltage generating unit RFG1 is the aforementioned temperature sensor.

Here, as described above, the reference voltage generating unit RFG1 generates the reference voltages Vthsen and Vthref baaed on the internal ground voltage GND1$i$. Accordingly, the reference voltages Vthsen and Vthref each include a dropped voltage component ΔGND1. However, the reference voltage generating unit RFG1 is not influenced by the voltage drop of the power supply voltage VDD1, thanks to its circuit structure in which the reference voltages Vthsen and Vthref are generated based on the internal ground voltage GND1$i$.

(Amplifier Unit OPA1)

The amplifier unit OPA1 amplifies the differential voltage between the reference voltage Vthref and the reference voltage Vthsen and outputs an amplified signal Vth1 (see FIGS. 6A and 6B). Note that, since the amplifier unit OPA1 cancels out the dropped voltage component ΔGND1 in each of the reference voltages Vthref and Vthsen, the amplifier unit OPA1 outputs the amplified signal Vth1 not including the dropped voltage component ΔGND1.

(Amplifier Unit OPA2)

The amplifier unit OPA2 amplifies the differential voltage between the internal power supply voltage VDD1$i$ and the reference voltage Vthsen and outputs an amplified signal Vth2 (see FIGS. 6C and 6D). Here, the internal power supply voltage VDD1$i$ includes the dropped voltage component ΔVDD1. Further, the reference voltage Vthsen includes the dropped voltage component ΔGND1. Accordingly, the amplifier unit OPA2 outputs the amplified signal Vth2 including the dropped voltage components ΔVDD1 and ΔGND1.

(Comparator Unit CMP1)

The comparator unit CMP1 compares the amplified signal Vth1 with the amplified signal Vth2 and outputs the comparison result as the measurement result. More specifically, the comparator unit CMP1 compares the amplified signal Vth1 not including the dropped voltage components ΔVDD1 and ΔGND1 and the amplified signal Vth2 including the dropped voltage components ΔVDD1 and ΔGND1, thereby outputting the measurement result including both of the dropped voltage components ΔVDD1 and ≠GND1. Further, since the comparator unit CMP1 cancels out the temperature dependence component in each of the amplified signals Vth1 and Vth2, the comparator unit CMP1 outputs the measurement result which is not influenced by the temperature.

Therefore, the monitor MNT1 can measure the voltage Va (=VDD1$i$−GND1$i$=(VDD1−ΔVDD1)=(GND1+ΔGND1)) that corresponds to the supply voltage supplied to the CPU 101.

Thereafter, the control unit CTL1 generates the control signal S1 corresponding to the comparison result of the comparator unit CMP1 ((that is, the measurement result of the monitor MNT1). The power supply IC 200 then adjusts the value of the power supply voltage VDD1 based on the control signal S1.

In this manner, the monitor MNT1 according to the present embodiment can precisely measure the supply voltage supplied to the CPU 101 which is a functional block. Thus, the semiconductor device 10 according to the present embodiment can supply a stable power supply voltage to the functional block or the semiconductor integrated circuit 100.

<Second Embodiment>

(Overview of Semiconductor Device 10 According to Second Embodiment)

Figure 7:
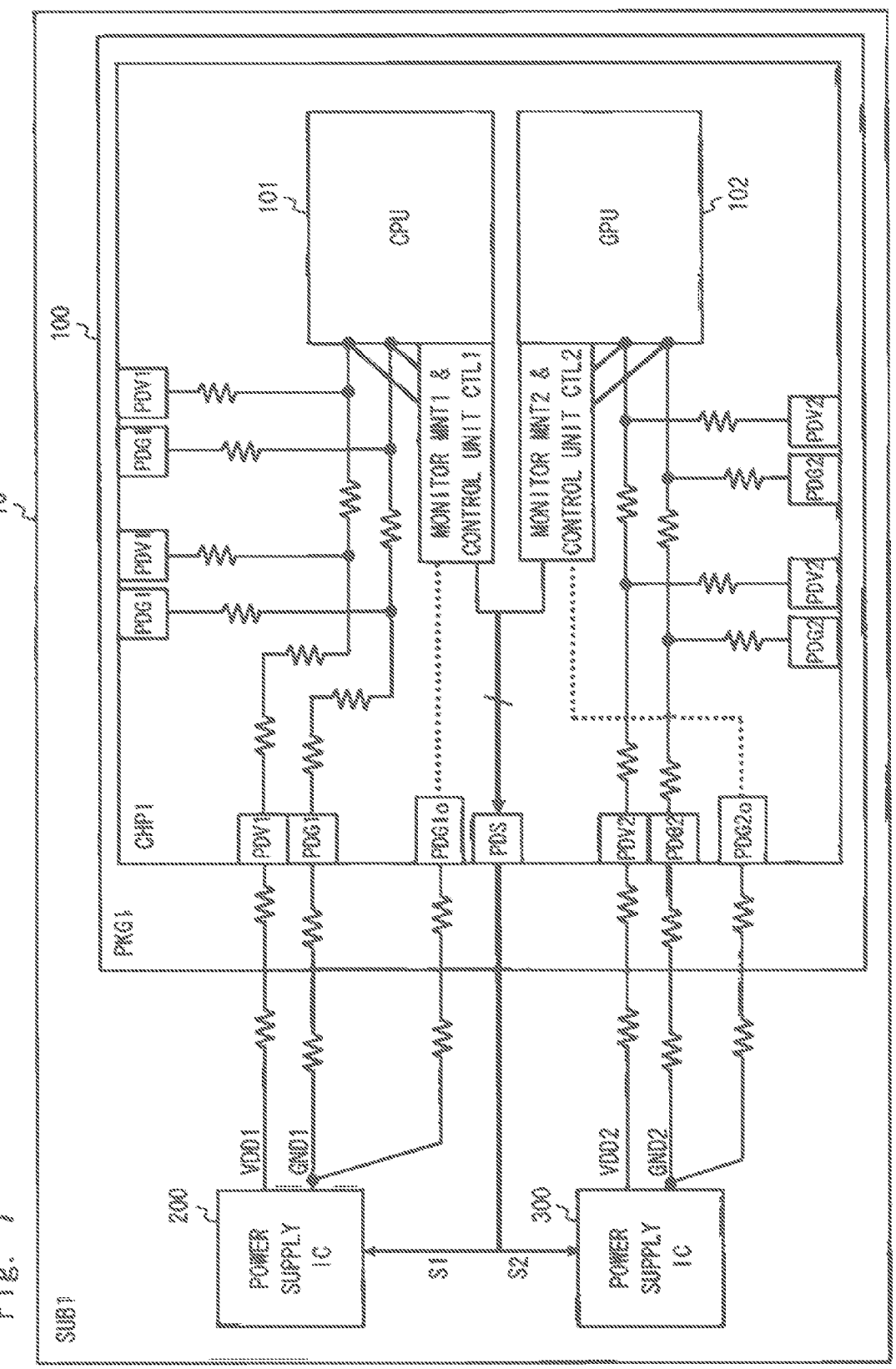
FIG. 7 is a plan view showing an exemplary structure of a semiconductor device 10 according to a second embodiments.

FIG. 7 is a plan view showing an exemplary structure of a semiconductor device 10 according to a second embodiment. The semiconductor device 10 shown in FIG. 7 further includes, as compared to the semiconductor device 10 shown in FIG. 2, pads PDG1$o$ and PDG2$o$ through which the semiconductor chip CMP1 supplies and receives ground voltages dedicated to the monitoring by the monitors MNT1 and MNT2.

For example, the monitors MNT1 and MNT2 are supplied with the ground voltage GND1 immediately below the semiconductor integrated circuit 100 as internal ground voltages (second internal ground voltage; GND1$o$ and GND2$o$ via the pads PDG1$o$ and PDG2$o$, respectively. Here, since the current consumption of the reference voltage generating unit RFG1 is small, the voltage drop attributed to the parasitic resistance of the ground voltage lines is negligible. That is, the internal ground voltages GND1$o$ and GND2$o$ show values which are substantially identical to those of the ground voltages GND1 and GND2.

The monitor MNT1 monitors (measures) the value of a voltage Vb (=VDD1$i$−GND1) that corresponds to the supply voltage supplied to the CPU 101. Note that the monitor MNT1 is arranged in close proximity to the CPU 101 so as to he able to precisely monitor the voltage. The control unit CTL1 generates a control signal (digital value) S1 corresponding to the measurement result of the monitor MNT1. The power supply IC 200 then adjusts the value of the power supply voltage VDD1 based on the control signal S1. Thus, it becomes possible to supply the CPU 101 with the internal power supply voltage VDD1$i$ within the range in which operations can be performed.

The monitor MNT2 monitors (measures) the value of a voltage (=VDD2$i$–GND2) that corresponds to the supply voltage supplied to the GPU 102. Note that the monitor MNT2 is arranged in close proximity to the GPU 102 so as to be able to precisely monitor the voltage. The control unit CTL2 generates a control signal (digital value) S2 corresponding to the measurement result of the monitor MNT2. The power supply IC 300 then adjusts the value of the power supply voltage VDD2 based on the control signal S2. Thurs, it becomes possible to supply the GPU 102 with the internal power supply voltage VDD2$i$ within the range in which operations can be performed.

Other structures of the semiconductor device 10 shown in FIG. 7 are identical to those of the semiconductor device 10 shown in FIG. 2 and, therefore, the description thereof is omitted.

Details Of Semiconductor Device 10 According To Second Embodiment

Figure 8:
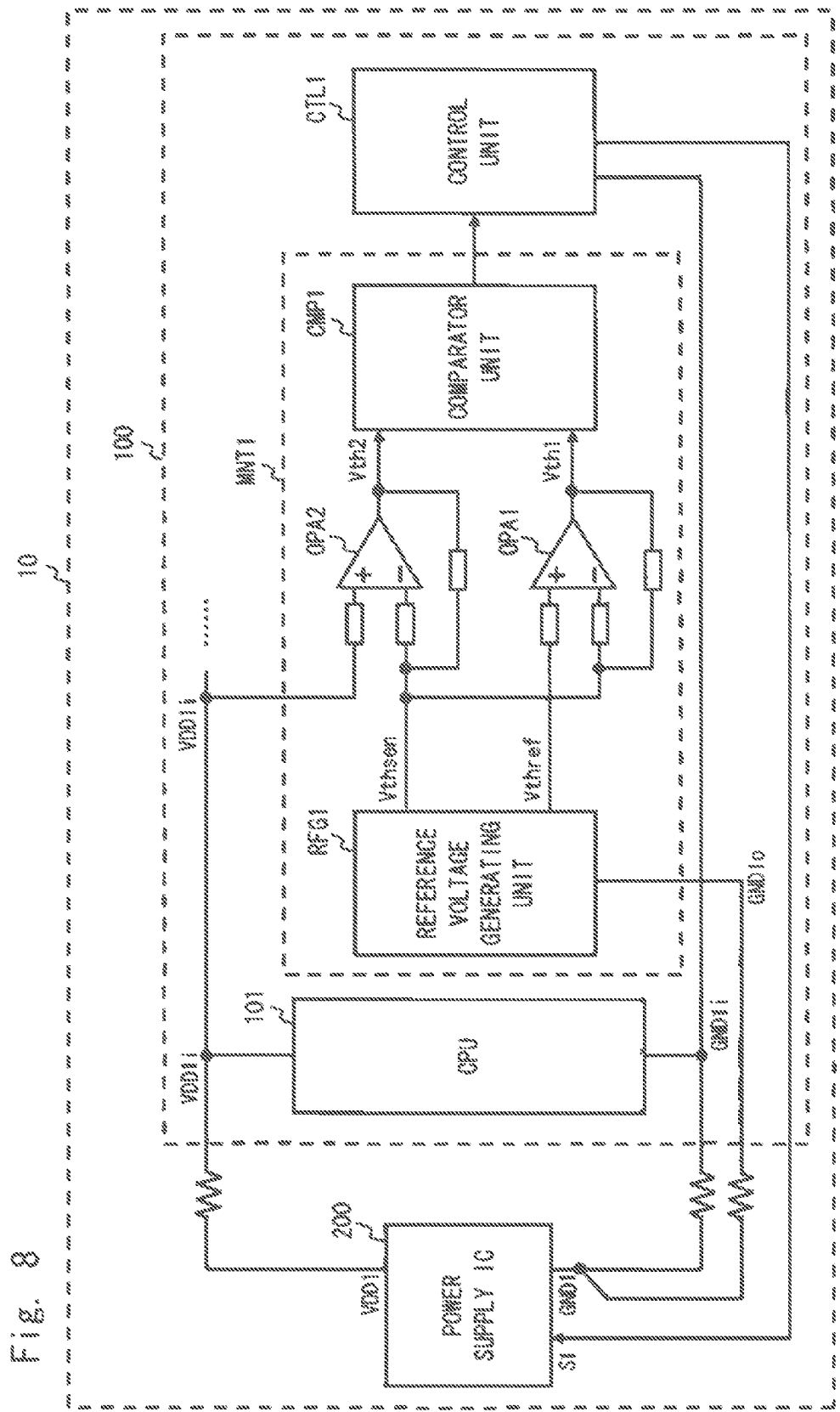
FIG. 8 is a block diagram showing an exemplary structure of the semiconductor device 10 according to the second embodiment.
Figure 9A:
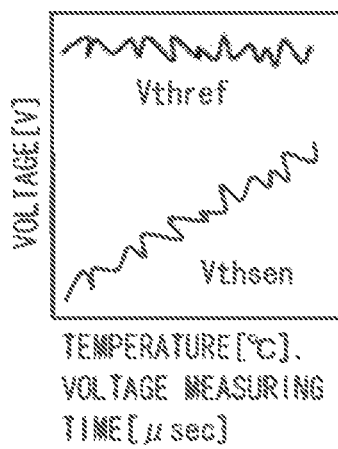
FIG. 9A is a diagram showing the temperature dependence of the reference voltages Vthsen and Vthref.
Figure 9B:
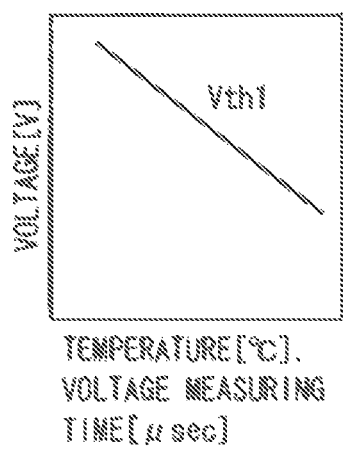
FIG. 9B is a diagram showing the temperature dependence of the amplified signal Vth1.
Figure 9C:
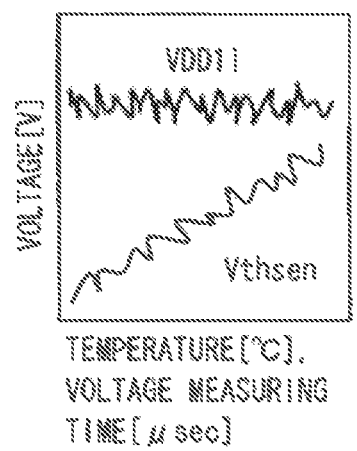
FIG. 9C is a diagram showing the temperature dependence of the internal power supply voltage VDD1$i$ and the reference voltage Vthsen.
Figure 9D:
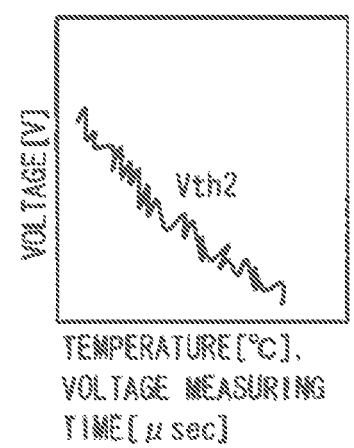
FIG. 9D is a diagram showing the temperature dependence of the amplified signal Vth2.

FIG. 8 is a block diagram showing an exemplary structure of the semi conductor device 10 according to the second embodiment. FIG. 9A is a diagram shooing the temperature dependence of the reference voltages Vthsen and Vthref. FIG. 9B is a diagram shooing the temperature dependence of the amplified signal Vth1. FIG. 9C is a diagram shoving the temperature dependence of the internal power supply voltage VDD1$i$ and the reference voltage Vthsen. FIG. 9D is a diagram shooing the temperature dependence of the amplified signal Vth2.

Note that, since the relationship among the power supply IC 200, the CPU 101, the monitor MNT1, and the control unit CTL1 and the relationship among the power supply IC 300, the CPU 102, the monitor MNT2, and the control unit CTL2 are basically the same, in the following, a description will be solely given of the power supply IC 200, the CPU 101, the monitor MNT1, and the control unit CTL1.

(Monitor MNT1)

As shown in FIG. 8, the reference voltage generating unit RFG1 included in the monitor MNT1 is supplied with an internal ground voltage GND1$o$ showing the value substantially identical to that of the ground voltage GND1, in place of the internal ground voltage GND1$i$ supplied to the CPU 101. Other structures of the monitor MNT1 shown in FIG. 8 are identical to those of the monitor MNT1 shown in FIG. 5 and, therefore, a description thereof is omitted.

(Reference Voltage Generating Unit RFG1)

The reference voltage generating unit RFG1 generates a reference voltage (first reference voltage) Vthsen and a reference voltage (second reference voltage) Vthref. Here specifically, the reference voltage generating unit RFG1 generates the reference voltage Vthsen and the reference voltage Vthref that is generated based on the ground voltage (internal ground voltage GND1$o$) which is common to the reference voltage Vthsen and that is different in value from the reference voltage Vthsen.

The reference voltage generating unit RFG1 is, for example, a bandgap reference temperature sensor (see FIG. 9A) that generates the reference voltage Vthsen with great temperature dependence and the reference voltage Vthref with a smaller temperature dependence than that of the reference voltage Vthsen (more preferably, the reference voltage Vthref is not temperature-dependent). In the present embodiment, a description will be given of an exemplary case where the reference voltage generating unit RFG1 is the aforementioned temperature sensor.

Here, as described above, the reference voltage generating unit RFG1 generates the reference voltages Vthsen and Vthref based on the internal ground voltage GND1$o$. Accordingly, neither of the reference voltages Vthsen and Vthref includes a dropped voltage component ΔGND1.

(Amplifier Unit OPA1)

The amplifier unit OPA1 amplifies the differential voltage between the reference voltage Vthref and the reference voltage Vthsen and outputs an amplified signal Vth1 (see FIGS. 9A and 9B). Note that the amplified signal Vth1 does not include the dropped voltage component ΔGND1.

(Amplifier Unit OPA2)

The amplifier unit OPA2 amplifies the differential voltage between the internal power supply voltage VDD1$i$ and the reference voltage Vthsen and outputs an amplified signal Vth2 (see FIGS. 9C and 9D). Here, the internal power supply voltage VDD1$i$ includes the dropped voltage component ΔVDD1. Accordingly, the amplifier unit OPA2 outputs the amplified signal Vth2 including the dropped voltage component ΔVDD1.

(Comparator Unit CMP1)

The comparator unit CMP1 compares the amplified signal Vth1 with the amplified signal Vth2 and outputs the measurement result. More specifically, the comparator unit CMP1 compares the amplified signal Vth1 not including the dropped voltage components ΔVDD1 and ΔGND1 and the amplified signal Vth2 including the dropped voltage component ΔVDD1, thereby outputting the measurement result including the element of the dropped voltage component ΔVDD1. Further, since the comparator unit CMP1 cancels out the temperature dependence component in each of the amplified signals Vth1 and Vth2, the comparator unit CMP1 outputs the measurement result which is not influenced by the temperature.

Therefore, the monitor MNT1 can measure the voltage Vb (=VDD1$i$–GND1=(VDD1–ΔVDD1)–GND1) that corresponds to the supply voltage supplied to the CPU 101.

Thereafter, the control unit CTL1 generates the control signal S1 corresponding to the comparison result of the comparator unit CMP1 (that is, the measurement result of the monitor MNT1). The power supply IC 200 adjusts the value of power supply voltage VDD1 based on the control signal S1.

In this manner, the monitor MNT1 according to the present embodiment can precisely measure the supply voltage supplied to the CPU 101 which is a functional block. Thus, the semiconductor device 10 according to the present embodiment can supply a stable power supply voltage to the functional block (or to the semiconductor integrated circuit 100).

Further, the monitor MNT1 according to the present embodiment employs the same ground voltages (reference) as to the power supply IC 200 and the monitor MNT1 and carries out measurement considering only the dropped voltage component ΔVDD1. Accordingly, the same feedback of the ground voltages (reference) can be obtained when the voltage of the power supply IC 200 is settled. This makes it possible to improve the measurement speed as compared to that of the first embodiment. This is particularly effective when high-speed processing is required, e.g., when the power supply voltage VDD1 extremely fluctuates because of alternating currant and when it is desired to follow the fluctuation to some extent. On the other hand, the monitor MNT1 according to the first embodiment carries out measurement considering the dropped voltage components ΔVDD1 and ΔGND1. Accordingly, though the monitor MNT1 according to the first embodiment is slower in measuring speed as compared to that of the present embodiment, it can perform measurement of higher precision than that of the present embodiment.

Further, in evaluating a completed semiconductor product (packaged semiconductor chip), a differential voltage (ΔVDIF) between the power supply IC or the voltage value of the power supply supplying the power supply voltage and the voltage value inside the semiconductor chip is measured. Then, a resistance value RX=ΔVDIF/ΔIDIF is obtained from the current value (ΔIDIF) of the power supply supplying the power supply voltage. When a line resistance (RY) on the measurement board used in evaluation is previously measured, RZ=RX−RY can be obtained. RZ is the resistance value of the completed semiconductor product (packaged semiconductor chip). Upon recording this value on software or the memory of the semiconductor chip, a current consumption IDDi can be obtained using the internal power supply voltage VDD1$i$ and RZ. The power supply device such as the power supply IC is generally controlled using values of voltage and current. By making it possible to measure the current consumption, the power supply device such as the power supply IC can be finely controlled.

<Third Embodiment>

Figure 10:
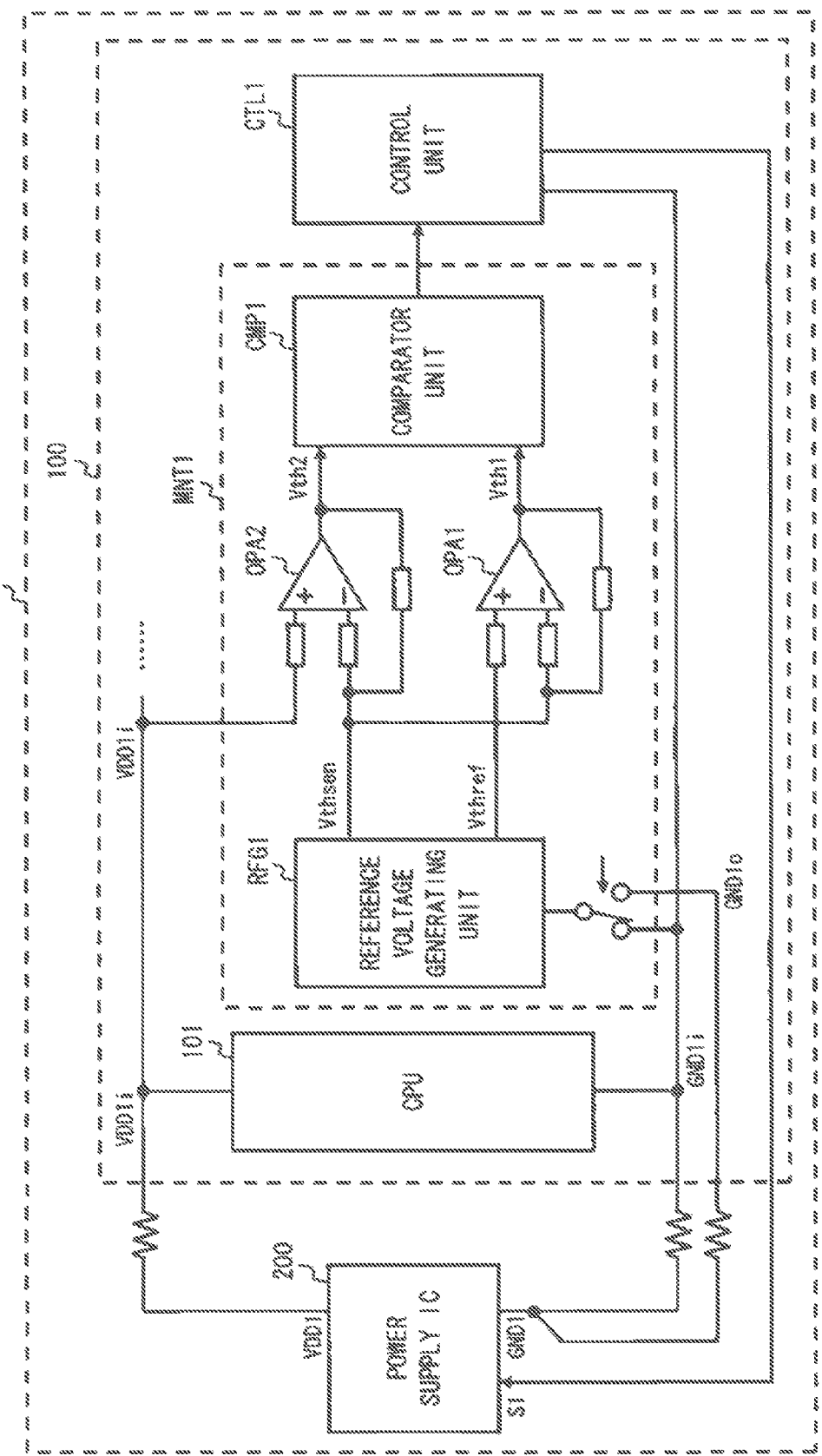
FIG. 10 is a block diagram showing an exemplary structure of a semiconductor device 10 according to a third embodiment.

FIG. 10 is a block diagram showing an exemplary structure of a semiconductor device 10 according to a third embodiment. As shown in FIG. 10, the reference voltage generating unit RFG1 provided at the monitor MNT1 can be selectively supplied with the internal ground voltage GND1$i$, which is supplied to the CPU 101, and the internal ground voltage GND1$o$ having a value which is substantially identical to that of the ground voltage GND1. Other structures and operations of the monitor MNT1 shown in FIG. 10 are similar to those of the monitor MNT1 shown in FIGS. 5 and 8 and, therefore, a description thereof is omitted.

The monitor MNT1 according to the present embodiment can achieve effects equivalent to those of the first and second embodiments.

<Fourth Embodiment>

In the present embodiment, a description will be given of the specific exemplary structures of the comparator unit CMP1.

(First Specific Exemplary Structure of Comparator Unit CMP1)

Figure 11:
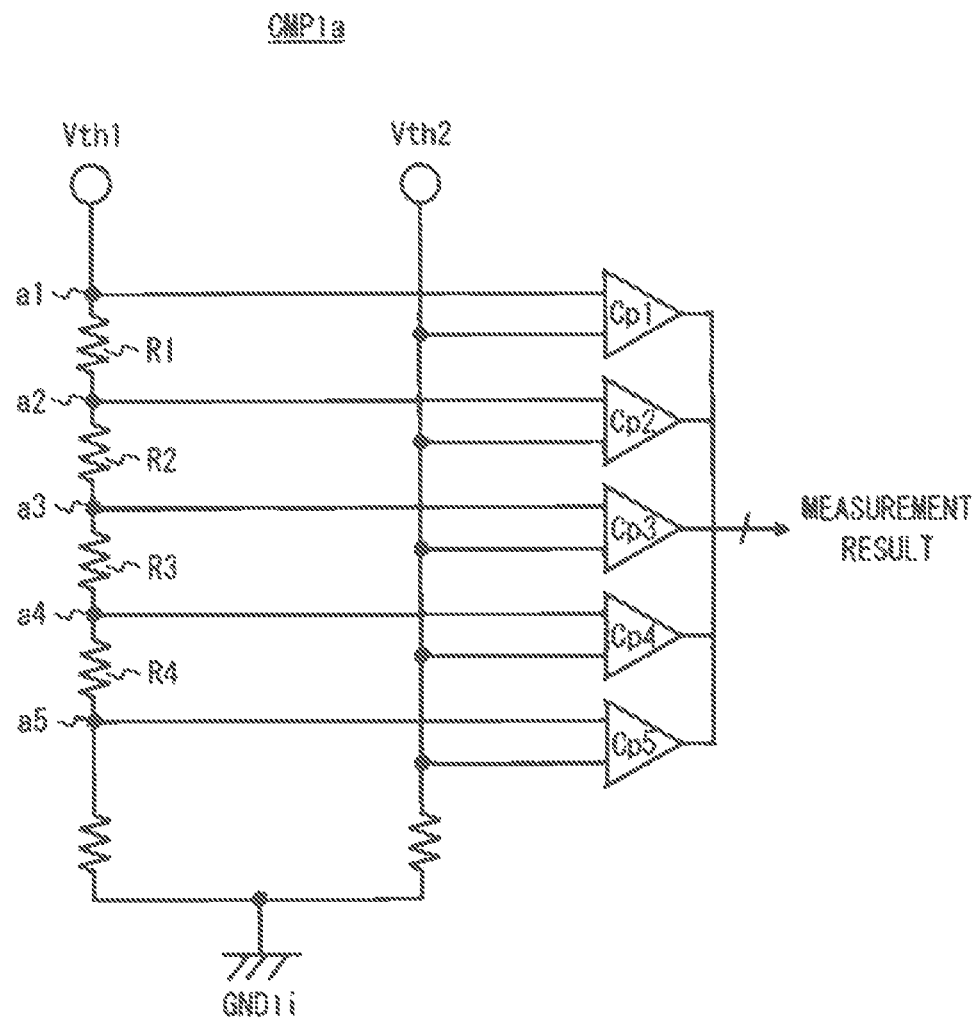
FIG. 11 is a diagram showing a first specific exemplary structure of a comparator unit CMP1 according to a fourth embodiment.
Figure 12A:
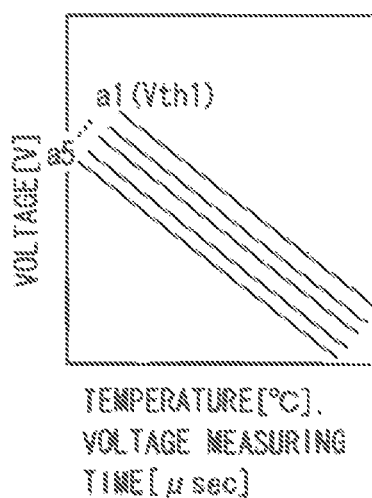
FIG. 12A is a diagram showing the temperature dependence of the voltage values of nodes a1 to a5.
Figure 12B:
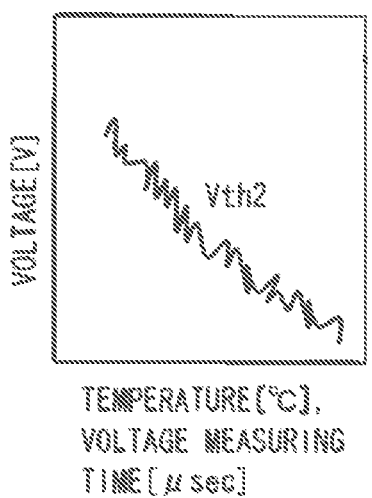
FIG. 12B is a diagram showing the temperature dependence of the amplified signal Vth2.
Figure 12C:
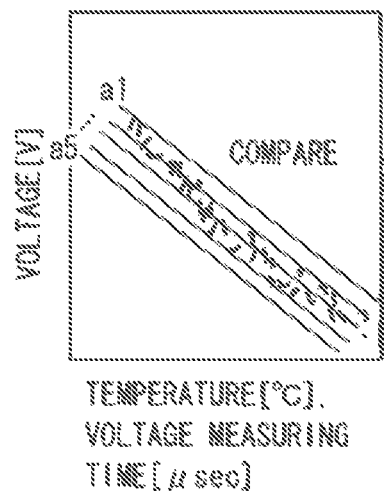
FIG. 12C is a diagram in which the voltage values of the nodes a1 to a5 and that of the amplified signal Vth2 are compared with each other.
Figure 12D:
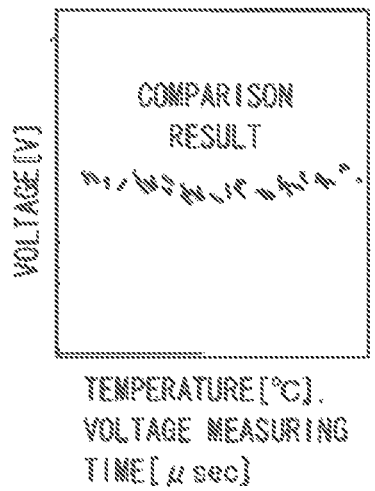
FIG. 12D is a diagram showing the result of the comparison between the voltage values of the nodes a1 to a5 and that of the amplified signal Vth2.

FIG. 11 is a diagram showing a first specific exemplary structure of the comparator unit CMP1 as a comparator unit CMP1$a$. FIG. 12A is a diagram showing the temperature dependence of the voltage values (comparative voltages) of nodes a1 to a5. FIG. 12B is a diagram showing the temperature dependence of the amplified signal Vth2. FIG. 12C is a diagram in which the voltage values of the nodes a1 to a5 and that of the amplified signal vth2 are compared with each other. FIG. 12D is a diagram showing the result of the comparison between the voltage values of the nodes a1 to a5 end that of the amplified signal Vth2.

The comparator unit CMP1$a$ shown in FIG. 11 has resistor elements R1 to R4 and comparators Cp1 to Cp5. The resistor elements R1 to R4 are provided lo series between a high voltage terminal supplied with the amplified signal Vth1 (hereinafter referred to as the high voltage terminal Vth1) and the ground voltage terminal GND1$i$ supplied with the internal ground voltage GND1$i$.

More specifically, one and of the resistor element R1 is connected to the high voltage terminal Vth1 via the node a1, and other and of the resistor element R1 is connected to the node a2. One and of the resistor element R2 is connected to the node a2, and other and of the resistor element R2 is connected to the node a3. One and of the resistor element R3 is connected to the node a3, and other and of the resistor element R3 is connected to the node a4. One and of the resistor element R4 is connected to the node a4, and other and of the resistor element R3 is connected to the ground voltage terminal GND1$i$ via the node a5. Vth1 and Vth2 are grounded to GND1$i$ as the single point GND, whereby fluctuations in GND1$i$ are expected to be canceled out by the comparing operations of Cp1 to Cp5.

The comparator Cp1 compares the voltage value of the node a1 and the voltage value of the amplified signal Vth2 with each other, and outputs the comparison result. The comparator Cp2 compares the voltage value of the node a2 and the voltage value of the amplified signal Vth2 with each other, and outputs the comparison result. The comparator Cp3 compares the voltage value of the node a3 and the voltage value of the amplified signal Vth2 with each other, and outputs the comparison result. The comparator Cp4 compares the voltage value of the node a4 and the voltage value of the amplified signal Vth2 with each other, and outputs the comparison result. The comparator Cp5 compares the voltage value of the node a5 and the voltage value of the amplified signal Vth2 with each other, and outputs the comparison result.

for example, when the voltage values of the nodes a1 to a5 represent 0.410 V, 0.405 V, 0,400 V, 0.305 V, and 0.390 V, respectively, and when the voltage value of the amplified signal Vth2 represents 0.406 V, the comparators Cp1 to Cp5 output comparison results 0, 1, 1, 1, and 1, respectively. The comparison results of the respective comparators Cp1 to Cp5 are each output as one measurement result (a digital, value).

In connection with the example shown in FIG. 11 and FIGS. 12A to 12D, though a description has been given of the case where the comparator unit CMP1$a$ includes five comparators Cp1 to Cp5, the present invention is not limited thereto. The comparator unit CMP1$a$ can be modified as appropriate to include N-pieces (N being any natural number) of comparators Cp1 to CpN. In accordance therewith, the comparator unit CMP1$a$ must be modified to include (N−1) pieces of resistor elements R1 to R (N−1).

(Second Specific Exemplary Structure of Comparator unit CMP1)

Figure 13:
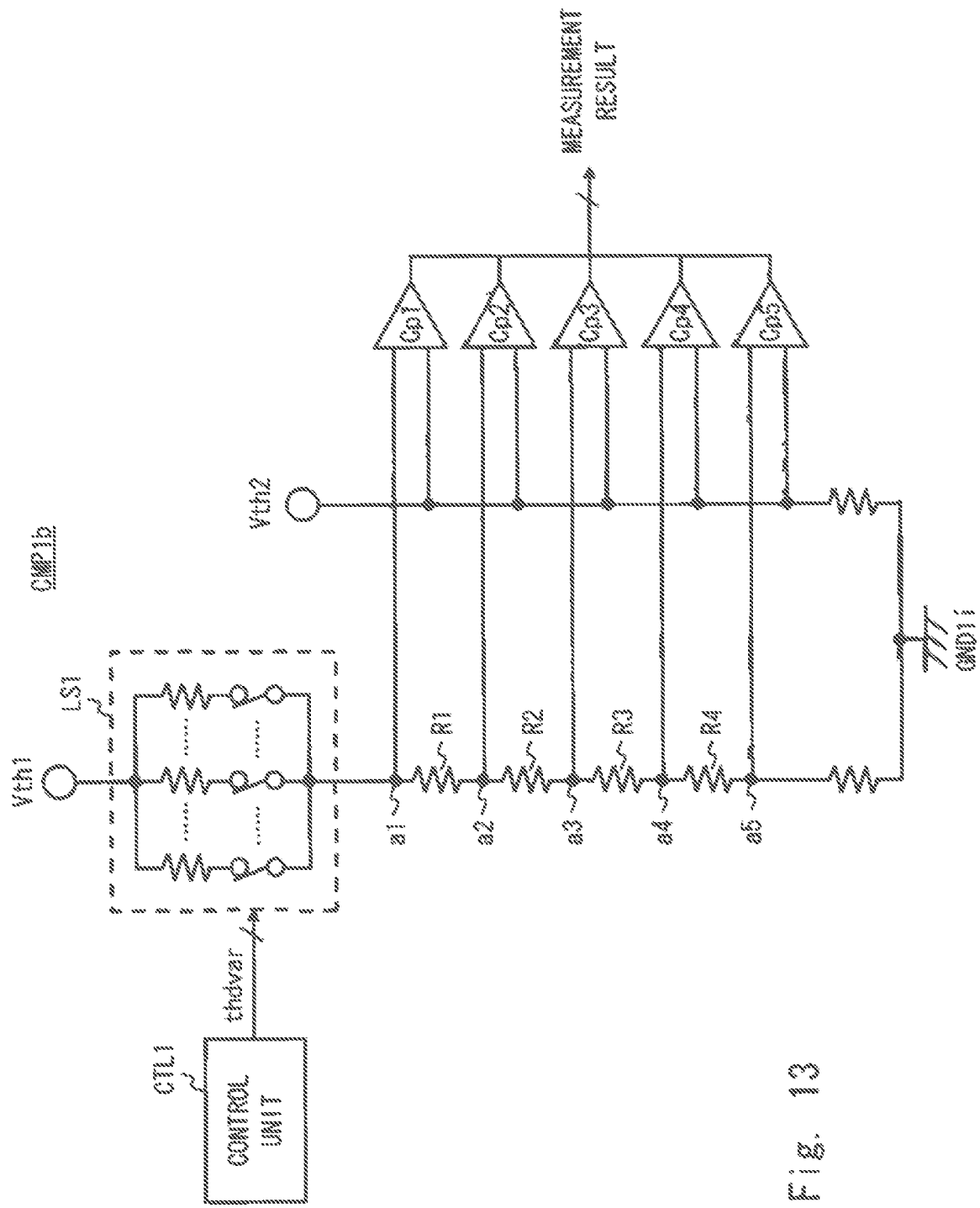
FIG. 13 is a diagram showing a second specific exemplary structure of the comparator unit CMP1 according to the fourth embodiment.
Figure 14A:
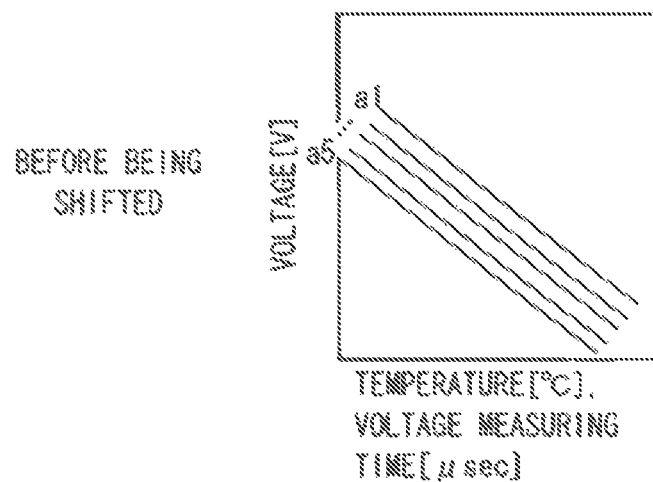
FIG. 14A is a diagram showing the temperature dependence of the voltage values of the nodes a1 to a5 before they are shifted.
Figure 14B:
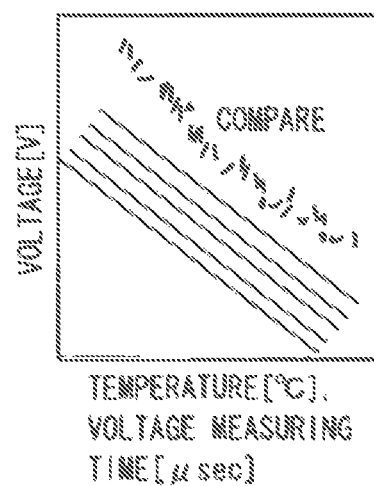
FIG. 14B is a diagram in which the voltage values of the nodes a1 to a5 before they are shifted and that of the amplified signal Vth2 are compared with each other.
Figure 14C:
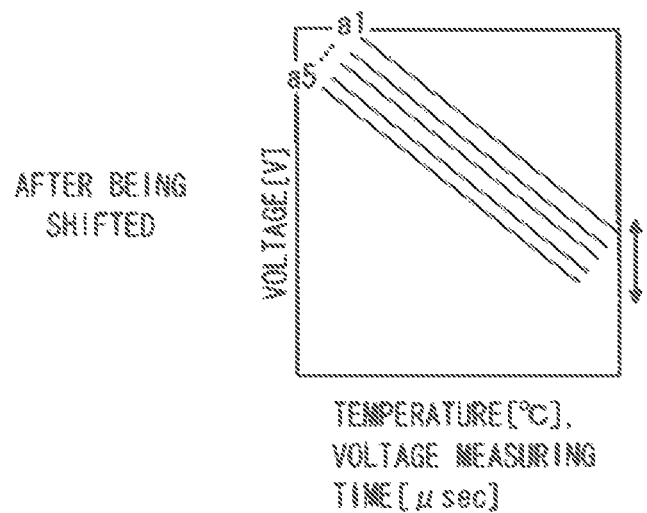
FIG. 14C is a diagram showing the temperature dependence of the voltage values of the nodes a1 to a5 after they are shifted.
Figure 14D:
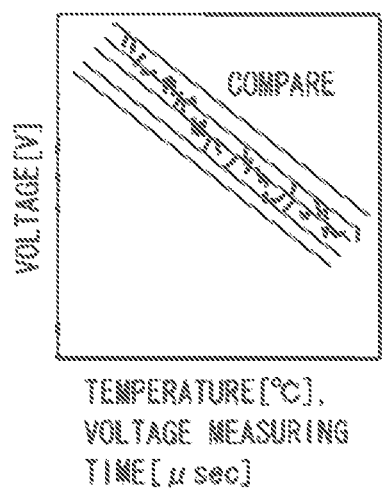
FIG. 14D is a diagram in which the voltage values of the nodes a1 to a5 after they are shifted and that of the amplified signal Vth2 are compared with each other.

FIG. 13 is a diagram showing a second specific exemplary structure of the comparator unit CMP1 as a comparator unit CMP1$b$. FIG. 14A is a diagram showing the temperature dependence of the voltage values of the nodes a1 to a5 before they are shifted. FIG. 14B is a diagram; in which the voltage values of the nodes a1 to a5 before they are shifted and that of the amplified signal Vth2 are compared with each other. FIG. 14C is a diagram showing the temperature dependence of the voltage values of the nodes a1 to a5 after they are shifted. FIG. 14D is a diagram in which the voltage values of the nodes a1 to a5 after they are shifted and that of the amplified signal Vth2 are compared with each other.

The comparator unit CMP1$b$ shown in FIG. 13 further includes a level shifter LS1 between the high voltage terminal Vth1 and the node a1, as compared to the comparator unit CMP1$a$ shown in FIG. 11. Other structures of the comparator unit CMP1$b$ shown in FIG. 13 are identical to those of the comparator unit CMP1$a$ shown in FIG. 11 and, therefore, a description thereof is omitted.

The level shifter LS1 includes a plurality of resistor elements Rls1 to RlaX (X being an integer equal to or greater than 2) arranged in parallel between the high voltage terminal vth1 and the node a1, and a plurality of switching elements Sls1 to SlsX respectively connected in series to the plurality of resistor elements Rls1 to PlsX. ON/OFF of the switching elements Sls1 to SlsX is controlled by a control signal thdvar from the control unit CTL1. Note that the value of the control signal thdvar is switched by, for example, a clock cycle.

For example, firstly, the switching elements Sls1 to SlsX are turned ON in turn by the control signal thdvar. In accordance therewith, the resistance value between the high voltage terminal Vth1 and the node a1 gradually becomes low, ashen the switching elements Sls1 to SlsX have all been turned ON, subsequently, the switching elements Sls1 to SlaX are turned OFF in turn by the control signal thdvar. In accordance therewith, the resistance value between the high voltage terminal Vth1 and the node a1 gradually becomes high. When the switching elements Sls1 to SlsX have all been turned OFF except for any one of them, the switching elements Sls1 to SlsX are again turned ON in torn by the control signal thdvar. As such operations are repetitively performed, the voltage values of the nodes a1 to a5 are successively shifted by a wide range. Allowing the toggling to be performed such that a shift of a set range is switched by a clock cycle, it becomes possible to conduct a comparison with the amplified signal Vth2 falling within the range of the voltage values of the nodes a1 to a5.

In connection with the example shown in FIG. 13 and FIGS. 14A to 14D, though a description has been given of the case where the comparator unit CMP1b includes five comparators Cp1 to Cp5, the present invention is not limited thereto. The comparator unit CMP1b can be modified as appropriate to include N-pieces (N being any natural number) of comparators Cp1 to CpN. In accordance therewith, the comparator unit CMP1b must be modified to include (N-1) pieces of resistor elements R1 to R (N-1).

(Third Specific Exemplary Structure of Comparator Unit CMP1)

Figure 16A:
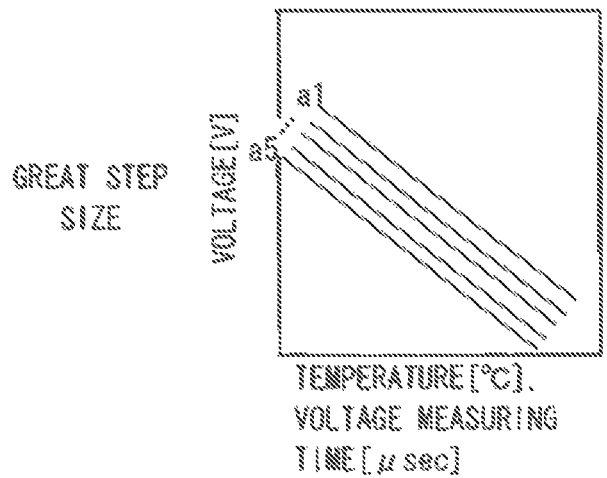
FIG. 16A is a diagram showing the temperature dependence of the voltage values of the nodes a1 to a5 with a great step size.
Figure 16B:
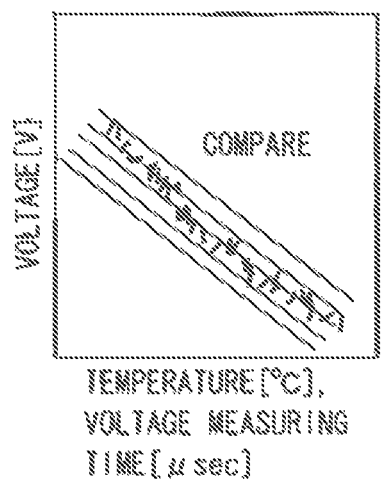
FIG. 16B is a diagram in which the voltage values of the nodes a1 to a5 with a great step sire and that of the amplified signal Vth2 are compared with each other.
Figure 16C:
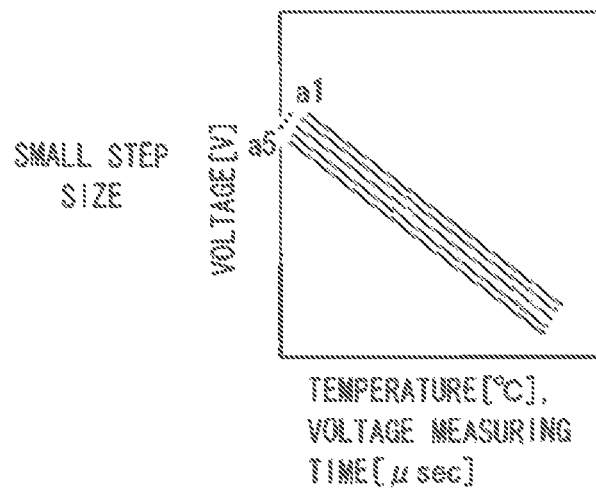
FIG. 16C is a diagram showing the temperature dependence of the voltage values of the nodes a1 to a5 with a small step size.
Figure 16D:
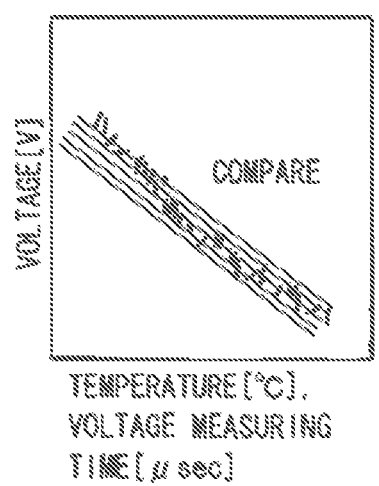
FIG. 16D is a diagram in union the voltage values of the nodes a1 to a5 with a small step site and that of the amplified signal Vth2 are compared with each other.

FIG. 15 is a diagram showing a third specific exemplary structure of the comparator unit CMP1 as a comparator unit CMP1c. FIG. 16A is a diagram showing the temperature dependence of the voltage values of the nodes a1 to a5 with a greet step size. FIG. 16B is a diagram in which the voltage values of the nodes a1 to a5 with a great step sirs and that of the amplified signal Vth2 are compared with each other. FIG. 16C is a diagram showing the temperature dependence of the voltage values of the nodes a1 to a5 with a small step size. FIG. 16D is e diagram in which the voltage values of the nodes a1 to a5 with a small step sire and the amplified signal Vth2 are compared with each other. By varying the step size, adjustment to the optimum value of the voltage width (resolution) required to be controlled can be achieved.

The comparator unit CMP1c shown in FIG. 15 further includes a step sire adjusting unit SS1 between the node a5 and the ground voltage terminal GND1i, as compared to the comparator unit. CMP1a shown in FIG. 11. Other structures of the comparator unit CMP1c shown in FIG. 15 are identical to those of the comparator unit CMP1a shown in FIG. 11 and, therefore, a description thereof is omitted.

The step sire adjusting unit SS1 include a plurality of resistor elements Rss1 to RssY (Y being an integer equal to or greater than 2) arranged in parallel between the node a5 and the ground voltage terminal GND1i, and a plurality of switching elements Sss1 to SssY respectively connected in series to the plurality of resistor elements Rss1 to RssY. ON/OFF of the switching elements Sss1 to SssY is controlled by a control signal thshift from the control unit CTL1. Note that the value of the control signal thshift is fixed, for example, after adjustment.

For example, the greater the number of switching elements turned ON out of the switching elements Sss1 to SssY, the smaller the resistance value between the node a5 and the ground voltage terminal GND1i. In accordance therewith, the step size of the voltage values of the nodes a1 to a5 becomes greater (see FIGS. 16A and 16B). On the other hand, the smaller the number of switching elements turned OFF out of the switching elements Sss1 to SssY, the greater the resistance value between the node a5 and the ground voltage terminal GND1i. In accordance therewith, the step size of the voltage values of the nodes a1 to a5 becomes smaller (see FIGS. 16C and 16D). By reducing the step size of the voltage values of the nodes a1 to a5, it becomes possible to improve the measurement precision of the amplified signal Vth2.

In connection with the example shown in FIG. 15 and FIGS. 16A to 16D, though a description has been given of the case where the comparator unit CMP1c includes five comparators Cp1 to Cp5, the present invention is not limited thereto. The comparator unit CMP1c can be modified as appropriate to include N-pieces (N being any natural number) of comparators Cp1 to CpN. In accordance therewith, the comparator unit CMP1c must be modified to include (N-1) pieces of resistor elements R1 to R (N-1).

(Fourth Specific Exemplary Structure of Comparator Unit CMP1)

Figure 17:
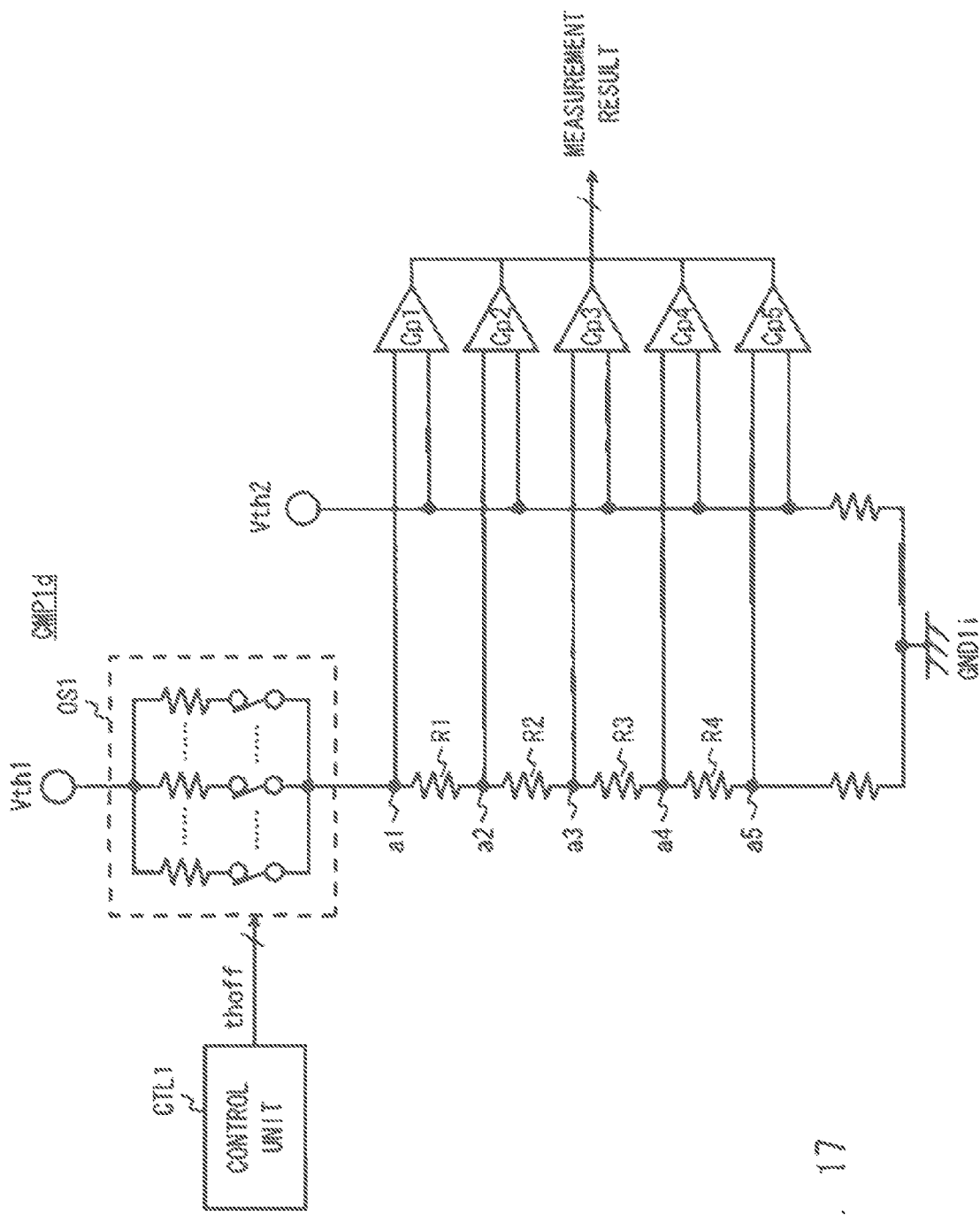
FIG. 17 is a diagram showing a fourth specific exemplary structure of the comparator unit CMP1 according to the fourth embodiment.
Figure 18A:
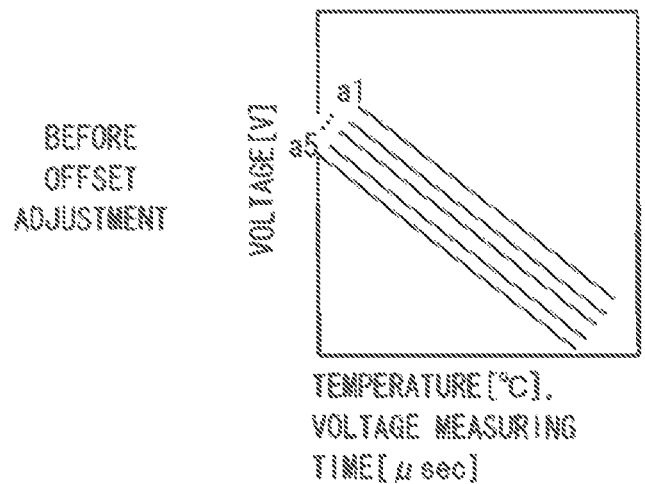
FIG. 18A is a diagram showing the temperature dependence of the voltage values of the nodes a1 to a5 before they are subjected to offset adjustment.
Figure 18B:
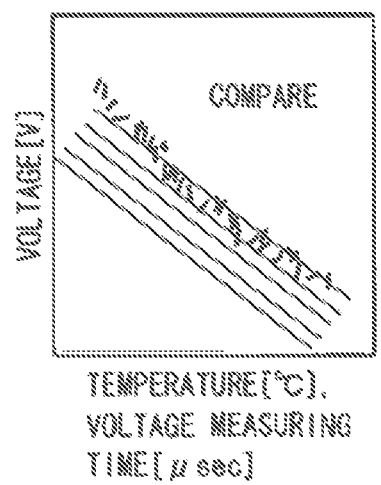
FIG. 18B is a diagram in which the voltage values of the nodes a1 to a5 before they are subjected to offset adjustment and that of the amplified signal Vth2 are compared with each other.
Figure 18C:
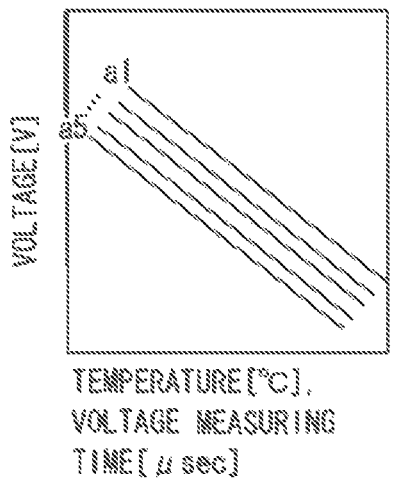
FIG. 18C is a diagram showing the temperature dependence of the voltage values of the nodes a1 to a5 after they are subjected to offset adjustments.
Figure 18D:
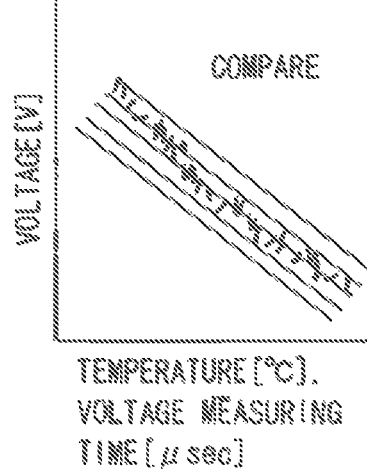
FIG. 18D is a diagram in which the voltage values of the nodes a1 to a5 after they are subjected to offset adjustment and that of the amplified signal Vth2 are compared with each other.

FIG. 17 is a diagram showing a fourth specific exemplary structure of the comparator unit CMP1 as a comparator unit CMP1d. FIG. 18A is a diagram showing the temperature dependence of the voltage values of the nodes a1 to a5 before they are subjected to offset adjustment. FIG. 18B is a diagram in which the voltage values of the nodes a1 to a5 before they are subjected to offset adjustment and the amplified signal Vth2 are compared with each other. FIG. 18C is a diagram shooing the temperature dependence of the voltage values of the nodes a1 to a5 after they are subjected to offset adjustment. FIG. 18D is a diagram in which the voltage values of the nodes a1 to a5 after they are subjected to offset adjustment and the amplified signal Vth2 are compared with each other.

The comparator unit CMP1d shown in FIG. 17 further includes an offset adjusting unit OS1 between the high voltage terminal Vth1 and the node a1, as compared to the comparator unit CMP1a shown in FIG. 11. Other structures of the comparator unit CMP1d shown in FIG. 17 are identical to those of the comparator unit CMP1a shown in FIG. 11 and, therefore, a description thereof is omitted.

The offset adjusting unit OS1 includes a plurality of resistor elements Ros1 to RosZ (Z being an integer equal to or greater than 2) arranged in parallel between the high voltage terminal Vth1 and the node a1, and a plurality of switching elements Sos1 to SosZ respectively connected in series to the plurality of resistor elements Ros1 to RosZ. ON/OFF of the switching elements Sos1 to SosZ is controlled by a control signal thoff from the control unit CTL1. Note that the value of the control signal thoff is fixed, for example, after adjustment.

For example, the greater the number of switching elements turned ON out of the switching elements Sos1 to SosZ, the smaller the resistance value between the high voltage terminal Vth1 and the node a1. On the other hand, the smaller the number of switching elements turned OFF out of the switching elements Sos1 to SosZ, the greater the resistance value between the high voltage terminal Vth1 and the node a1. By adjusting ON/OFF of the switching elements Sos1 to SosZ to thereby adjust the resistance value between the high voltage terminal Vth1 and the node a1, the voltage values of the nodes a1 to a5 can be finely adjusted (see FIGS. 18A to 18D). The characteristics of semiconductors vary for each chip. In order to precisely compare the absolute values of voltages, variations in the characteristics of semiconductors (offset) must be adjusted during manufacture. The offset adjusting unit OS1 adjusts the value of variations in the characteristics (offset) obtained upon checking the characteristics (selection) of semiconductors during manufacture thereof.

In connection with the example shown in FIG. 17 and FIGS. 18A to 18D, though a description has been given of the case where the comparator unit CMP1d includes five comparators Cp1 to Cp5, the present invention is not limited thereto. The comparator unit CMP1d can be modified as appropriate to include N-pieces (N being any natural number) of comparators Cp1 to CpN. In accordance therewith, the comparator unit CMP1d must be modified to include (N-1) pieces of resistor elements R1 to R (N-1).

(Fifth Specific Exemplary Structure of Comparator Unit CMP1)

Figure 19:
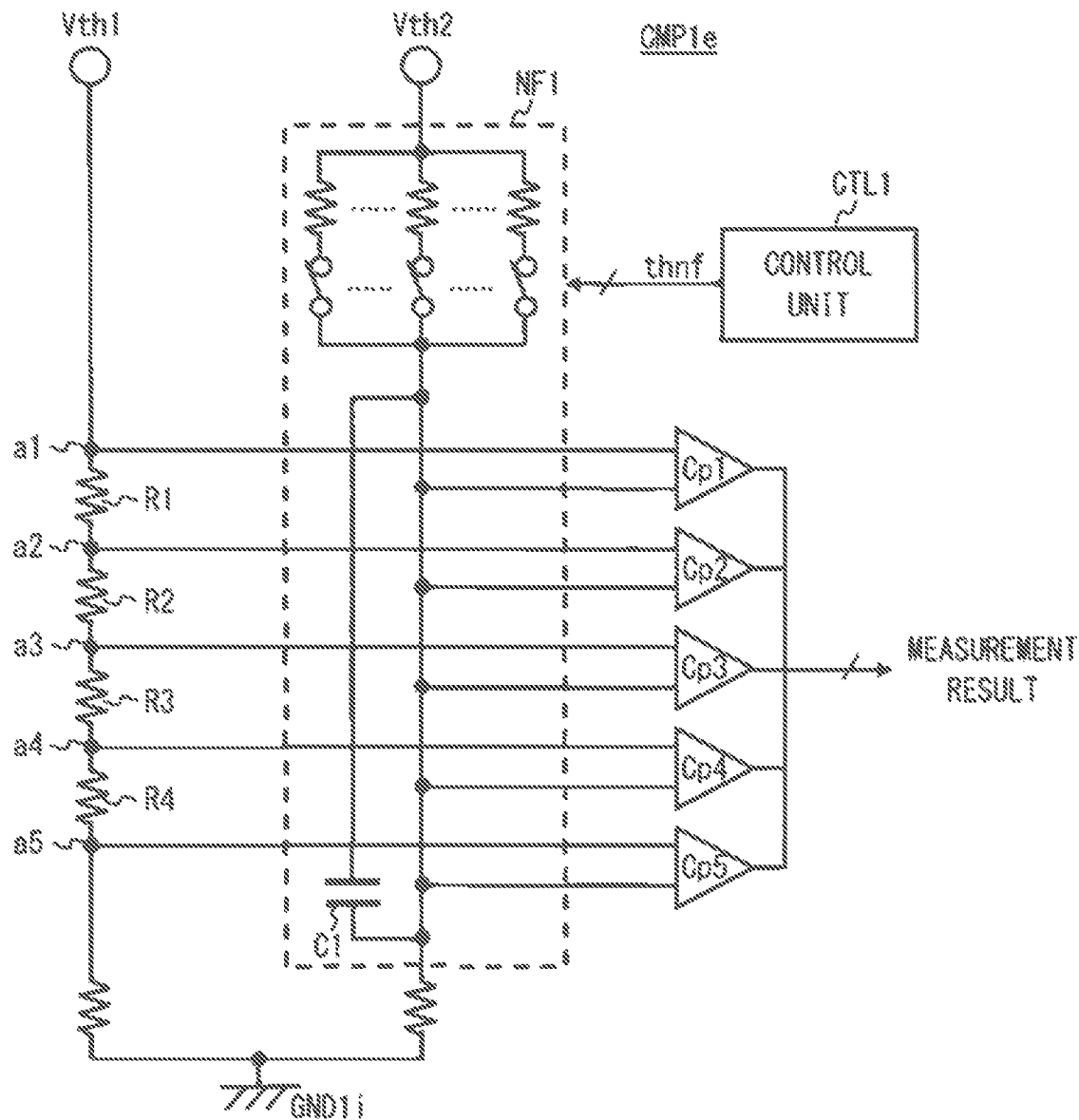
FIG. 19 is a diagram showing a fifth specific exemplary structure of the comparator unit CMP1 according to the fourth embodiment.
Figure 20A:
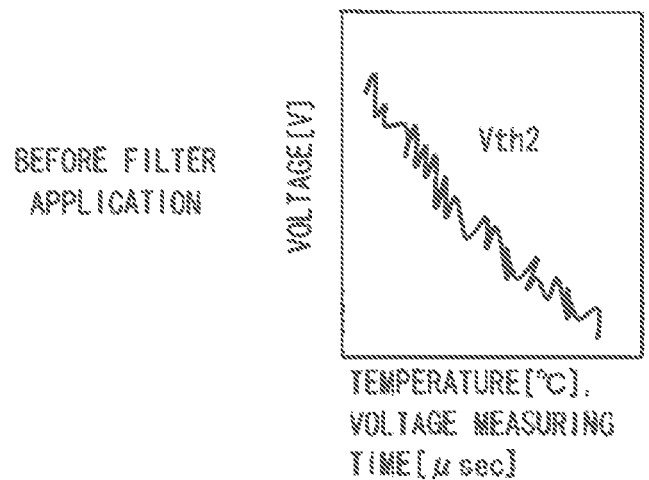
FIG. 20A is a diagram showing the temperature dependence of the voltage values of the nodes a1 to a5 before application of a noise filter.
Figure 20B:
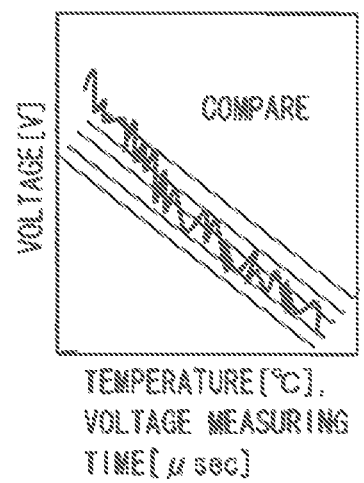
FIG. 20B is a diagram in which the voltage values of the nodes a1 to a5 before application of a noise filter and that of the amplified signal Vth2 are compared with each other.
Figure 20C:
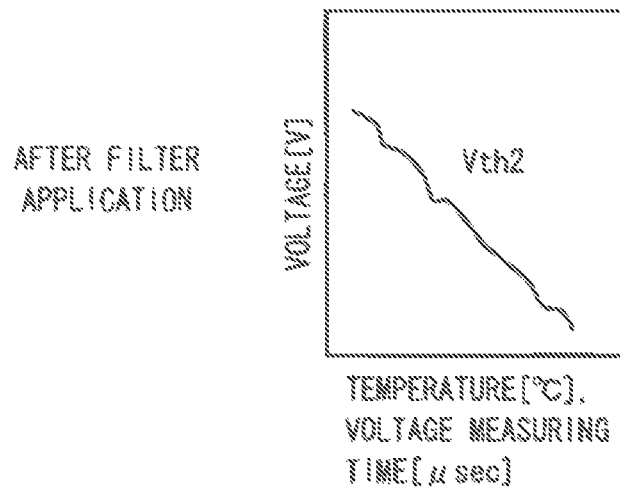
FIG. 20C is a diagram showing the temperature dependence of the voltage values of the nodes a1 to a5 after application of a noise filter.
Figure 20D:
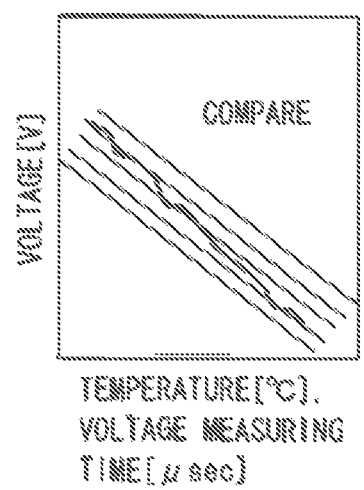
FIG. 20D in a diagram in which the voltage values of the nodes a1 to a5 after application of a noise filter and that of the amplified signal Vth2 are compared with each other.

FIG. 19 is s diagram shoeing a fifth specific exemplary structure of the comparator unit CMP1 as a comparator unit CMP1e. FIG. 20A is a diagram showing the temperature dependence of the voltage values of the nodes a1 to a5 before application of a noise filter. FIG. 20B is a diagram in which voltage values of the nodes a1 to a5 before application of a noise filter and that of the amplified signal Vth2 are compared with each other. FIG. 20C is a diagram showing the temperature dependence of the voltage values of the nodes a1 to a5 after application of a noise filter. FIG. 20D is a diagram in which the voltage values of the nodes a1 to a5 after application of a noise filter and that of the amplified signal Vth2 are compared with each other.

The comparator unit CMP1e shown in FIG. 19 further includes a noise filter NF1 on the input terminal (non-inverting input terminal) side of the comparators Cp1 to Cp5 to which the amplified signal Vth2 is supplied, as compared to the comparator unit CMP1a shown in FIG. 11. Other structures of the comparator unit CMP1e shown in FIG. 19 are identical to those of the comparator unit CMP1a shown in FIG. 11 and, therefore, a description thereof is omitted.

The noise filter NF1 includes a plurality of resistor elements Rnf1 to RnfM (M being an integer equal to or greater than 2) arranged in parallel between the high voltage terminal (hereinafter referred to as the high voltage terminal vth2) supplied with the amplified signal Vth2 and the non-inverting input terminals of the comparators Cp1 to Cp5, a plurality of switching elements Snf1 to SnfM respectively connected In series to the plurality of resistor elements Rnf1 to PnfM, and a capacitor element C1 provided between the non-inverting input terminals of the comparators Cp1 to Cp5 and the ground voltage terminal GND1i, OF/OFF of the switching elements Snf1 to SnfM is controlled by a control signal thnf from the control unit CTL1. Note that the value of the control signal thnf is fixed, for example, after adjustment.

The comparator unit CMP1e can suppress unnecessary fluctuations of the amplified signal Vth2 that extremely fluctuate during comparing operations, by removing noises from the amplified signal Vth2 through use of the noise filter NF1. Accordingly, a stable comparison result (measurement result) can be output.

In connection with the example shown in FIG. 19 and FIGS. 20A to 20D, though a description has been given of the case where the comparator unit CMP1e includes five comparators Cp1 to Cp5, the present invention is not limited thereto. The comparator unit CMP1e can be modified as appropriate to include N-pieces (N being any natural number) of comparators Cp1 to CpN. In accordance therewith, the comparator unit CMP1e must be modified to include (N-1) pieces of resistor elements R1 to R(N-1).

Note that the comparator unit CMP1 may be used in combination with some of or all the level shifter LS1, the step size adjusting unit SS1, the offset adjusting unit OS1, and the noise filter NF1.

As described above, the monitor circuit (MNT1, MNT2) according to the first to fourth embodiments can precisely measure the supply voltage supplied to the functional blocks (CPU 101 end GPU 102). Thus, the semiconductor device (10) according to the first to fourth embodiments can supply a stable power supply voltage to a functional block or the semiconductor integrated circuit 100.

In connection with the embodiments described above, though a description has been given of the case where one monitor and control unit set is provided to one functional block, the present invention is not limited thereto. One monitor and control unit, set may be shared by a plurality of functional blocks.

Further, in connection with, the embodiments described above, though a description has been given of the case where the functional blocks and the control units are individually provided, the present invention is not limited thereto. A functional block may function as a control unit. For example, the CPU 101 as a functional block may function as the control unit CTL1.

Still further, in connection with the embodiments described above, though a description has been given of the case where the ground voltage GND1 and the ground voltage GND2 are different from each other, the present invention is not limited thereto. It goes without saying that the ground voltage GND1 and the ground voltage GND2 may be identical.

Still further, in connection with the embodiments described above, though a description has been given of the case where two functional blocks are provided on the semiconductor chip CMP1, the present invention is not limited thereto. It goes without saying that one or more functional blocks and a corresponding number of monitors and control units may be provided on the semiconductor chip CMP1.

In the foregoing, the invention made by the inventors has been specifically described based on the embodiments. However, it gees without saying that the present invention is not limited to the foregoing embodiments, and various modifications can be made within the scope not departing from the gist of the present invention.

The first to fourth embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:
1. A monitor circuit comprising:
 a reference voltage generating unit that generates a first reference voltage and a second reference voltage based on a common ground voltage, the second reference voltage being different in value from that of the first reference voltage;

a first amplifier unit that amplifies a differential voltage between the first reference voltage and the second reference voltage;

a second amplifier unit that amplifies a differential voltage between an internal power supply voltage supplied to a functional block in a semiconductor integrated circuit and the first reference voltage; and a comparator unit that compares an amplification result of the first amplifier unit and an amplification result of the second amplifier unit with each other and outputs a comparison result as a measurement result, wherein the reference voltage generating unit selectively uses, as the common ground voltage, a first internal ground voltage or a second internal ground voltage that is substantially identical to an external ground voltage.

2. The monitor circuit according to claim 1, wherein:
the functional block is supplied with an external power supply voltage, generated outside the semiconductor integrated circuit, as the internal power supply voltage via a power supply voltage line,
the functional block is supplied with the external ground voltage, generated outside the semiconductor integrated circuit, as the first internal ground voltage via a ground voltage line, and
the reference voltage generating unit uses the first internal ground voltage to generate the first and second reference voltages.

3. The monitor circuit according to claim 1, wherein:
the functional block is supplied with an external power supply voltage, generated outside the semiconductor integrated circuit, as the internal power supply voltage via a power supply voltage line,
the function unit is supplied with the external ground voltage, generated outside the semiconductor integrated circuit, as the first internal ground voltage via a ground voltage line, and
the reference voltage generating unit uses the second internal ground voltage to generate the first and second reference voltages.

4. The monitor circuit according to claim 1, wherein:
the reference voltage generating unit is a bandgap reference temperature sensor that generates the first reference voltage and the second reference voltage, and
the second reference voltage has a temperature dependence smaller than the first reference voltage.

5. The monitor circuit according to claim 1, wherein:
the reference voltage generating unit is a bandgap reference temperature sensor that generates the first reference voltage and the second reference voltage,
the first reference voltage is dependent on temperature, and
the second reference voltage is not dependent on temperature.

6. The monitor circuit according to claim 1, wherein the comparator unit includes:
a plurality of resistor elements, generating a plurality of comparative voltages of different voltage values, coupled in series between the amplification result of the first amplifier unit and a first internal ground voltage; and
a plurality of comparators that respectively compare the plurality of comparative voltages with the amplification result of the second amplifier unit.

7. The monitor circuit according to claim 6, wherein:
the comparator unit further includes a level shifter provided between a high voltage terminal supplied with the amplification result of the first amplifier unit and the plurality of resistor elements, and a resistance value of the level shifter changes on a cyclical basis.

8. The monitor circuit according to claim 6, wherein:
the comparator unit further includes a step size adjusting unit provided between a ground voltage terminal supplied with the first internal ground voltage and the plurality of resistor elements, and
the step size adjusting unit adjusts a resistance value.

9. The monitor circuit according to claim 6, wherein:
the comparator unit further includes an offset adjusting unit provided between a high voltage terminal supplied with the amplification result of the first amplifier unit and the plurality of resistor elements, and
the offset adjusting unit adjusts a resistance value.

10. The monitor circuit according to claim 6, wherein the comparator unit further includes a noise filter that removes a noise from the amplification result of the second amplifier unit.

11. The monitor circuit according to claim 1, further comprising:
a current measuring unit that calculates a current consumption based on a resistance value and the internal power supply voltage,
wherein the resistance value is based on a differential voltage between an external power supply voltage generated outside the semiconductor integrated circuit and the internal power supply voltage, and a current value corresponding to the external power supply voltage.

12. A semiconductor integrated circuit, comprising:
monitor circuit according to claim 1; and
a control unit that controls a value of an external power supply voltage, generated outside the semiconductor integrated circuit, based on the measurement result of the monitor circuit,
wherein the functional block is supplied with the external power supply voltage as the internal power supply voltage via a power supply voltage line.

13. A semiconductor device, comprising:
a power supply integrated circuit (IC) that generates an external power supply voltage; and
a semiconductor integrated circuit, including:
the monitor circuit according to claim 1; and
a control unit that controls a value of the external power supply voltage based on the measurement result of the monitor circuit,
wherein the functional block is supplied with the external power supply voltage as the internal power supply voltage via a power supply voltage line.

14. A semiconductor device comprising:
a power supply integrated circuit (IC) that generates an external power supply voltage; and
a semiconductor integrated circuit, including:
a functional block supplied with the external power supply voltage as an internal power supply voltage via a power supply voltage line;
a monitor circuit that measures at least a value of the internal power supply voltage; and
a control unit that controls a value of the external power supply voltage based on a measurement result of the monitor circuit,
wherein the monitor circuit includes:
a reference voltage generating unit that generates a first reference voltage and a second reference voltage that is generated based on a ground voltage which is common to the first reference voltage, the second reference voltage being different in value from the first reference voltage;

a first amplifier unit that amplifies a differential voltage between the first reference voltage and the second reference voltage;

a second amplifier unit that amplifies a differential voltage between the internal power supply voltage and the first reference voltage; and a comparator unit that compares an amplification result of the first amplifier unit and an amplification result of the second amplifier unit with each other and outputs a comparison result as the measurement result.

15. A method of controlling a power supply voltage of a semiconductor device, the method comprising:

measuring a value of an internal power supply voltage of a functional block, wherein an external power supply voltage generated outside a semiconductor integrated circuit is supplied to the functional block as the internal power supply voltage via a power supply voltage line; and controlling a value of the external power supply voltage based on a result of the measurement, wherein measuring the value of the internal power supply voltage includes:

generating a first reference voltage and a second reference voltage that is generated based on a ground voltage which is common to the first reference voltage, the second reference voltage being different in value from the first reference voltage;

amplifying a differential voltage between the first reference voltage and the second reference voltage;

amplifying a differential voltage between the internal power supply voltage and the first reference voltage; and comparing an amplification result of the differential voltage between the first reference voltage and the second reference voltage and an amplification result of the differential voltage between the internal power supply voltage and the first reference voltage with each other and outputting a comparison result as the measurement result.

* * * * *